US00RE46154E

(19) United States
(12) Reissued Patent
Fasoli et al.

(10) Patent Number: US RE46,154 E
(45) Date of Reissued Patent: Sep. 20, 2016

(54) PAGE BUFFER PROGRAM COMMAND AND METHODS TO REPROGRAM PAGES WITHOUT RE-INPUTTING DATA TO A MEMORY DEVICE

(71) Applicant: SanDisk 3D LLC, Milpitas, CA (US)

(72) Inventors: Luca Fasoli, Campbell, CA (US); Yuheng Zhang, Saratoga, CA (US); Gopinath Balakrishnan, San Jose, CA (US)

(73) Assignee: SanDisk Technologies LLC, Plano, TX (US)

(21) Appl. No.: 14/285,829

(22) Filed: May 23, 2014

Related U.S. Patent Documents

Reissue of:
(64) Patent No.: 8,397,024
Issued: Mar. 12, 2013
Appl. No.: 12/414,925
Filed: Mar. 31, 2009

U.S. Applications:
(60) Provisional application No. 61/108,507, filed on Oct. 25, 2008.

(51) Int. Cl.
*G06F 12/00* (2006.01)
*G11C 16/10* (2006.01)

(52) U.S. Cl.
CPC ..... *G11C 16/102* (2013.01)

(58) Field of Classification Search
CPC ..... G06F 12/00; G06F 12/02; G06F 12/06; G06F 12/16; G11C 16/06; G11C 16/08; G11C 16/10; G11C 16/102; G11C 11/5628; H01L 27/11514
See application file for complete search history.

(56) References Cited

U.S. PATENT DOCUMENTS 5,418,940 A * 5/1995 Mohan ..... G06F 11/08 707/999.202
5,825,782 A 10/1998 Roohparvar
6,034,882 A * 3/2000 Johnson et al. ..... 365/103
6,046,936 A 4/2000 Tsujikawa et al.
(Continued)

FOREIGN PATENT DOCUMENTS

JP 2007310680 A 11/2007
JP 2008234723 A 10/2008

OTHER PUBLICATIONS

English translation of JP2008-234723A.*
(Continued)

*Primary Examiner* — Behzad Peikari
(74) *Attorney, Agent, or Firm* — Vierra Magen Marcus LLP

(57) ABSTRACT

A technique for efficiently handling write operation failures in a memory device which communicates with an external host device allows a page of data to be re-written to a memory array from a page buffer. The host provides user data, a first write address and a write command to the memory device. If the write attempt fails, the host provides a re-write command with a new address, without re-sending the user data to the memory device. Additional data can be received at a data cache of the memory device while a re-write from the page buffer is in progress. The re-written data may be obtained in a copy operation in which the data is read out to the host, modified and written back to the memory device. Additional data can be input to the memory device during the copy operation. Page buffer data can also be modified in place.

34 Claims, 14 Drawing Sheets

(56) References Cited

U.S. PATENT DOCUMENTS

| | | | | |
|---|---|---|---|---|
| 6,070,229 | A | 5/2000 | Voss | |
| 6,601,132 | B2 | 7/2003 | Nomura et al. | |
| 6,798,697 | B2 * | 9/2004 | Hosono | G11C 16/10 365/185.12 |
| 6,927,999 | B2 | 8/2005 | Sim et al. | |
| 7,388,782 | B2 * | 6/2008 | Tokiwa | 365/185.09 |
| 7,405,976 | B2 | 7/2008 | Hebishima | |
| 7,472,331 | B2 | 12/2008 | Kim | |
| 7,571,282 | B2 * | 8/2009 | Nishihara | 711/118 |
| 7,644,224 | B2 * | 1/2010 | Murin et al. | 711/103 |
| 8,139,406 | B2 * | 3/2012 | Park et al. | 365/185.02 |
| 8,397,024 | B2 | 3/2013 | Fasoli et al. | |
| 2002/0093032 | A1 | 7/2002 | Hanzawa et al. | |
| 2002/0191459 | A1 | 12/2002 | Tsujikawa et al. | |
| 2004/0177054 | A1 * | 9/2004 | Stern et al. | 707/1 |
| 2005/0055493 | A1 | 3/2005 | Wang | |
| 2005/0223243 | A1 | 10/2005 | Moore et al. | |
| 2007/0101096 | A1 | 5/2007 | Gorobets | |
| 2007/0174578 | A1 | 7/2007 | Oshima | |
| 2008/0101118 | A1 | 5/2008 | Patrascu et al. | |
| 2008/0151637 | A1 | 6/2008 | Doyle | |

OTHER PUBLICATIONS

International Preliminary Report on Patentability dated May 5, 2011, International Application No. PCT/US2009/057992 filed Sep. 23, 2009.

Chinese Office Action dated Apr. 24, 2013, Chinese Patent Application No. 20098014219436.

Response to Office Action dated Sep. 9, 2013, Chinese Patent Application No. 200980142194.36.

English translation of amended claims filed with Response to Office Action dated Sep. 9, 2013, Chinese Patent Application No. 200980142194.36.

Chinese Office Action dated Dec. 30, 2013, Chinese Patent Application No. 200980142194.36.

Response to Office Action dated Mar. 14, 2014, Chinese Patent Application No. 200980142194.36.

English translation of amended claims filed with Response to Office Action dated Mar. 14, 2014, Chinese Patent Application No. 200980142194.36.

Japanese Office Action dated Jul. 23, 2013, Japanese Patent Application No. JP 2011-533210.

English Abstract of Japanese Publication No. JP2007310680 published on Nov. 29, 2007.

Response to Office Action dated Oct. 2, 2013, Japanese Patent Application No. JP 2011-533210.

English translation of Amended Claims filed in Response to Office Action dated Oct. 2, 2013, Japanese Patent Application No. JP 2011-533210.

Chinese Search Report dated Mar. 18, 2015, Chinese Patent Application No. 098136069.

English machine-translation of Japanese Publication No. JP2007-310680 published Nov. 29, 2007.

Korean Office Action dated Jun. 20, 2015, Korean Patent Application No. 10-2011-7011939.

Response to Office Action dated Aug. 20, 2015, Korean Patent Application No. 10-2011-7011939.

English translation of claims filed in Response to Office Action dated Aug. 20, 2015, Korean Patent Application No. 10-2011-7011939.

Toshiba Corp., Machine translation JP 2008234723, Oct. 2, 2008.*

International Search Report & The Written Opinion of the International Searching Authority dated Jan. 25, 2010 in International Patent Application No. PCT.US2009/057992 filed Sep. 23, 2009.

Toshiba, Tentative Toshiba MOS Digital Integrated Circuit Silicon Gate CMOS, TH58NVG1S3AFT05, 2003.

International Preliminary Report on Patentability dated Apr. 26, 2011, International Application No. PCT/US2009/057992 filed Sep. 23, 2009.

Response to Office Action dated Dec. 9, 2011, European Patent Application No. 09792884.0.

* cited by examiner

Fig. 2
(Amended)
case 1
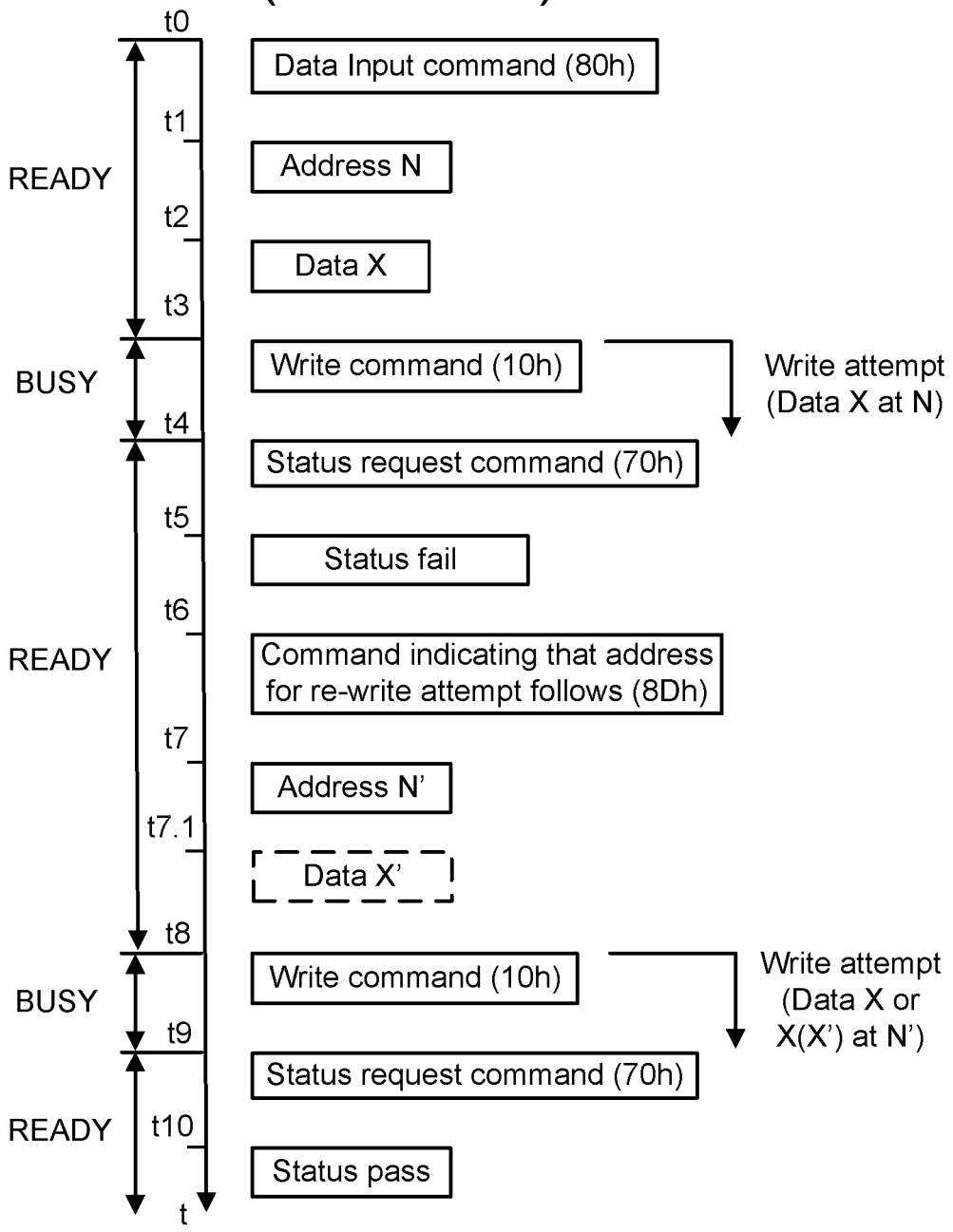

Fig. 3 (Amended)
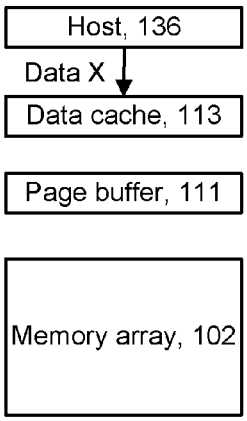
Fig. 4 (Amended)
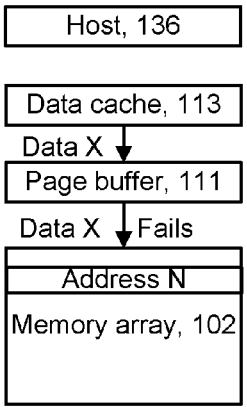
Fig. 5 (Amended)
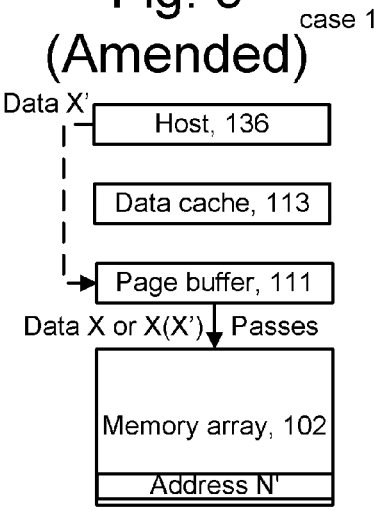
Fig. 6 (Amended)
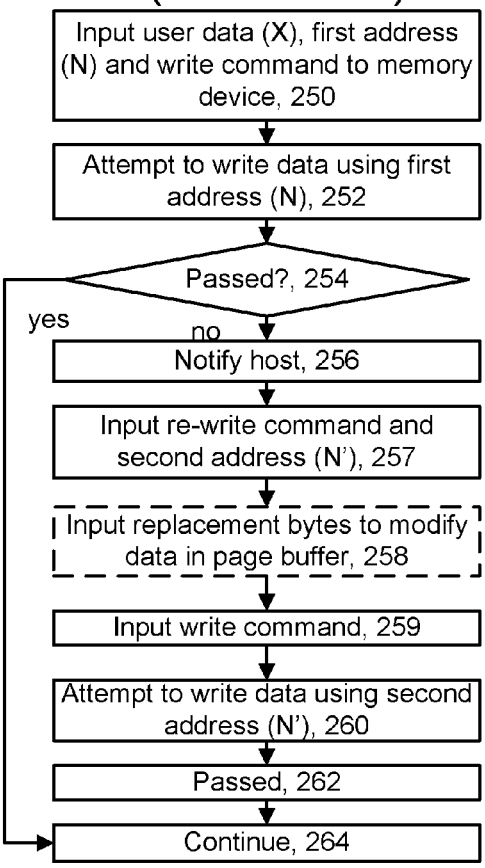
Fig. 7 (Amended)
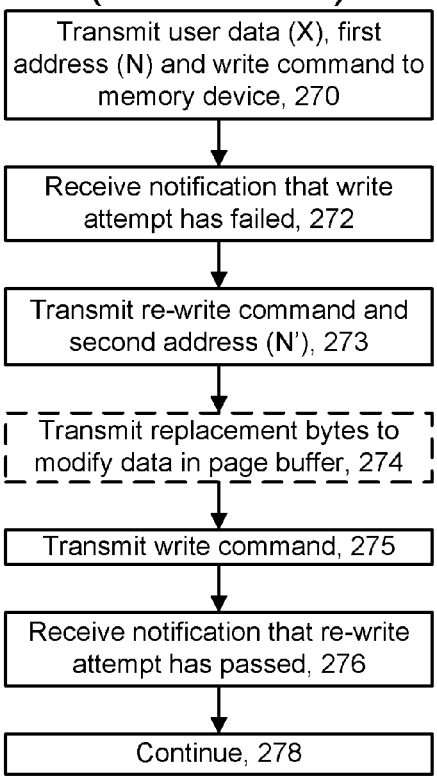

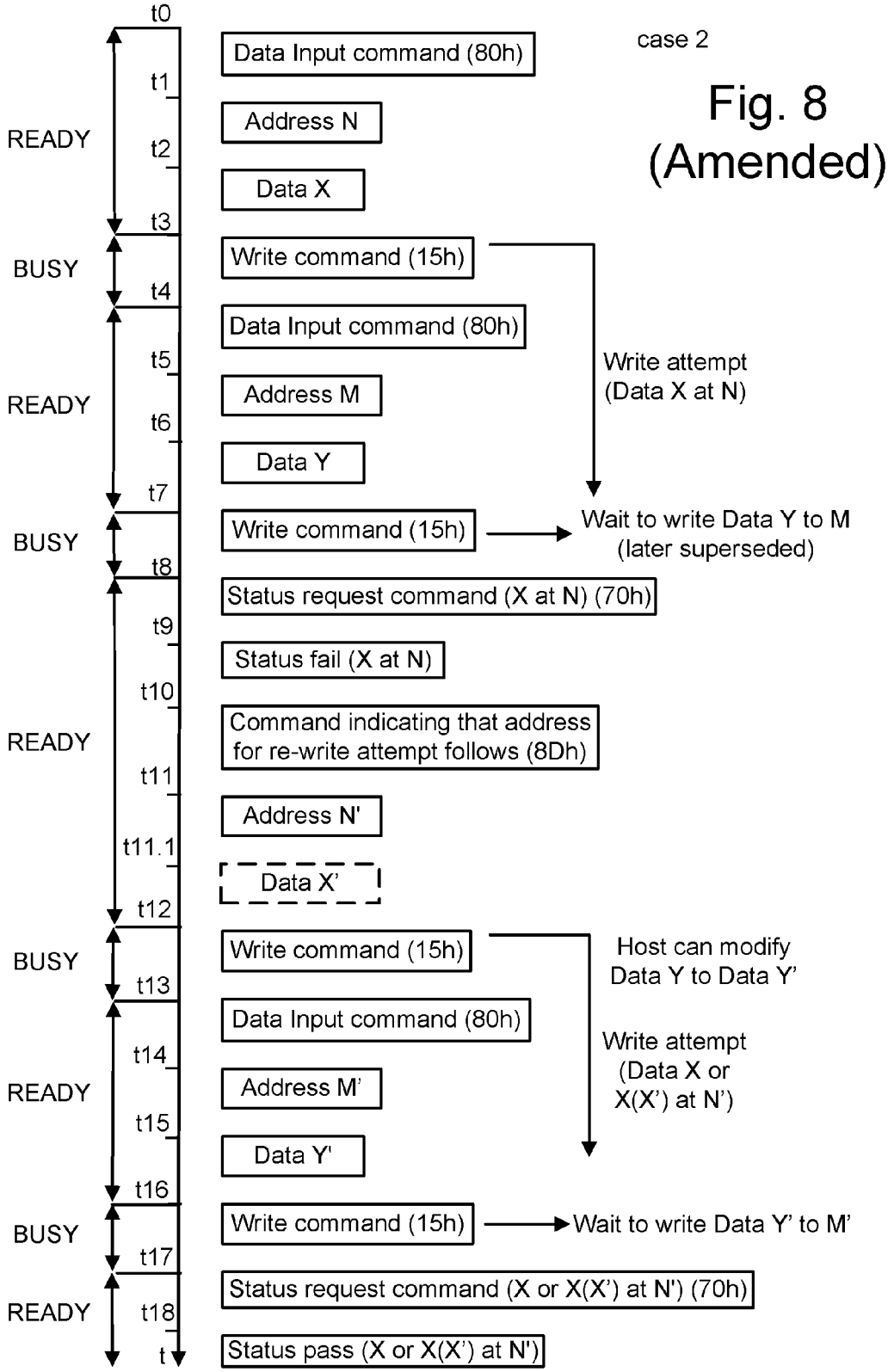
case 2
Fig. 8
(Amended)
t0
t1
t2
t3
t4
t5
t6
t7
t8
t9
t10
t11
t11.1
t12
t13
t14
t15
t16
t17
t18
t
READY
BUSY
READY
BUSY
READY
BUSY
READY
BUSY
READY
Data Input command (80h)
Address N
Data X
Write command (15h)
Data Input command (80h)
Address M
Data Y
Write command (15h)
Status request command (X at N) (70h)
Status fail (X at N)
Command indicating that address for re-write attempt follows (8Dh)
Address N'
Data X'
Write command (15h)
Data Input command (80h)
Address M'
Data Y'
Write command (15h)
Status request command (X or X(X') at N') (70h)
Status pass (X or X(X') at N')
Write attempt (Data X at N)
Wait to write Data Y to M (later superseded)
Host can modify Data Y to Data Y'
Write attempt (Data X or X(X') at N')
Wait to write Data Y' to M' case 2
Fig. 9 (Amended)
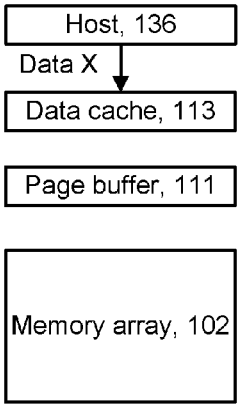
Fig. 10 (Amended)
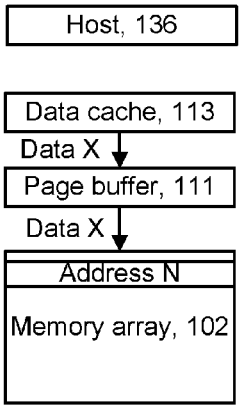
Fig. 11 (Amended)
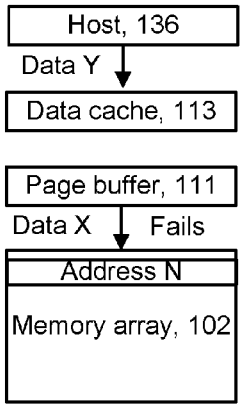
Fig. 12 (Amended)
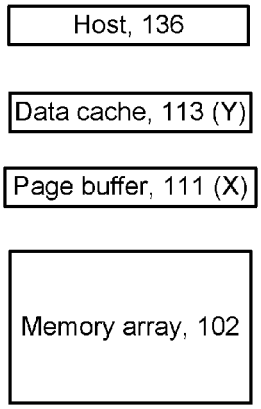
Fig. 13 (Amended)
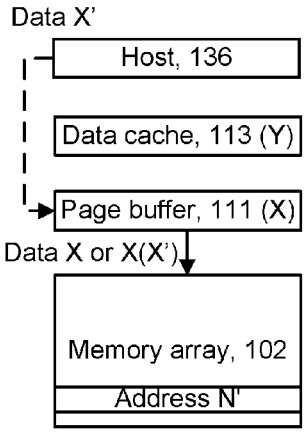
Fig. 14 (Amended)
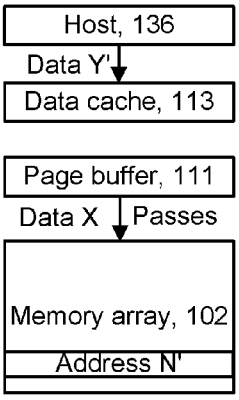
Fig. 15 (Amended)
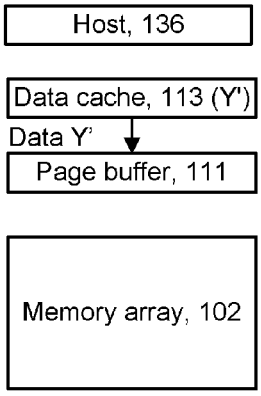

Fig. 16
(Amended)
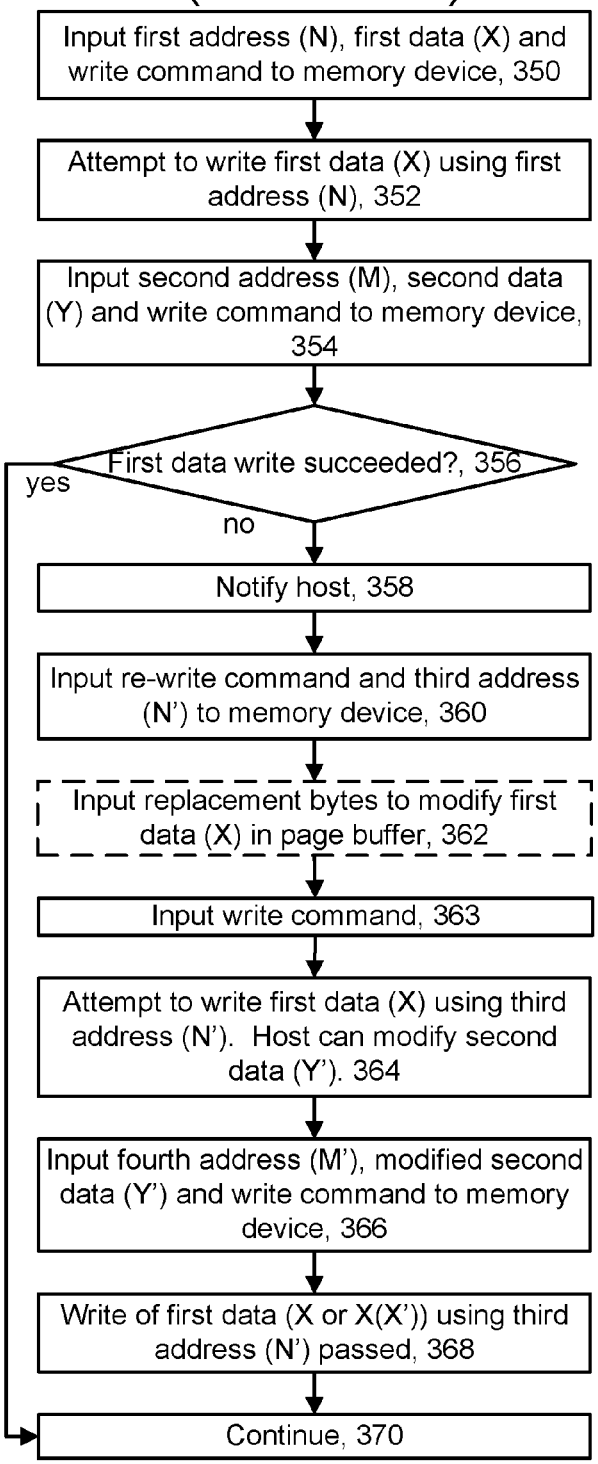

Fig. 17
(Amended)
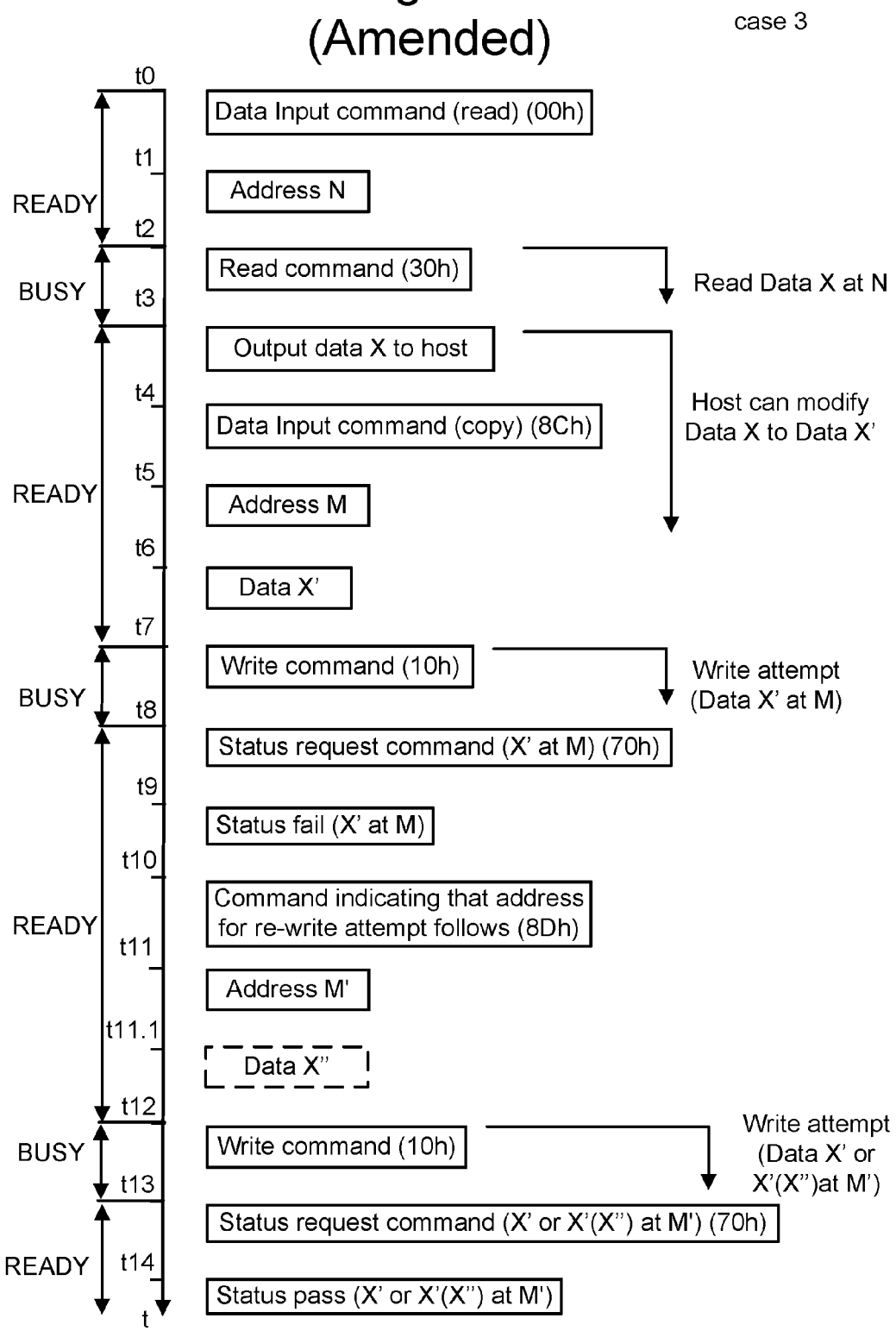

Fig. 18
(Amended)
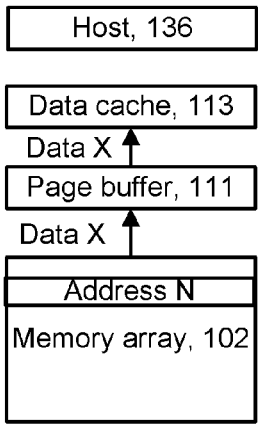
Fig. 19
(Amended)
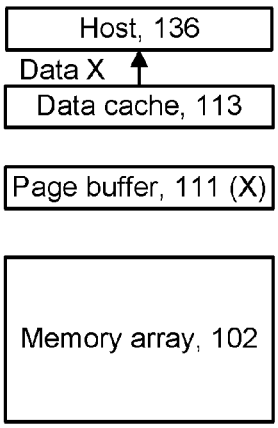
case 3
Fig. 20
(Amended)
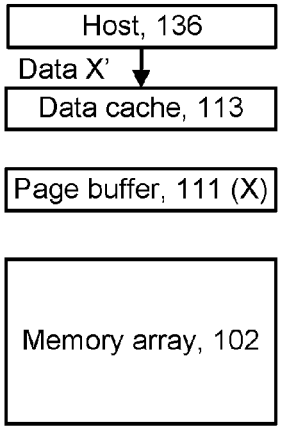
Fig. 21
(Amended)
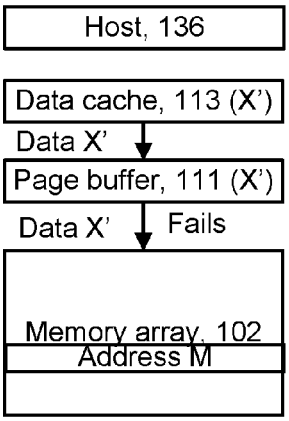
Fig. 22
(Amended)
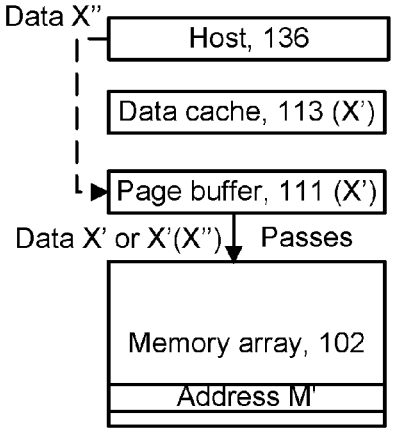

Fig. 23
(Amended)
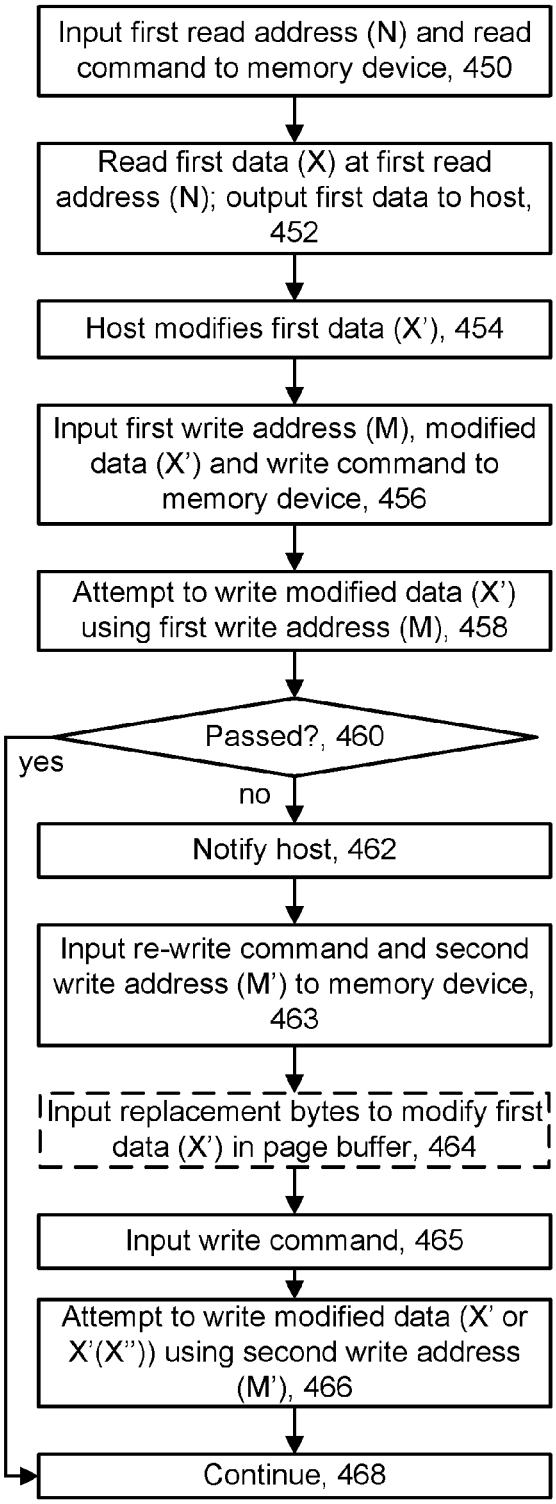

Fig. 24
(Amended)
case 4, part 1
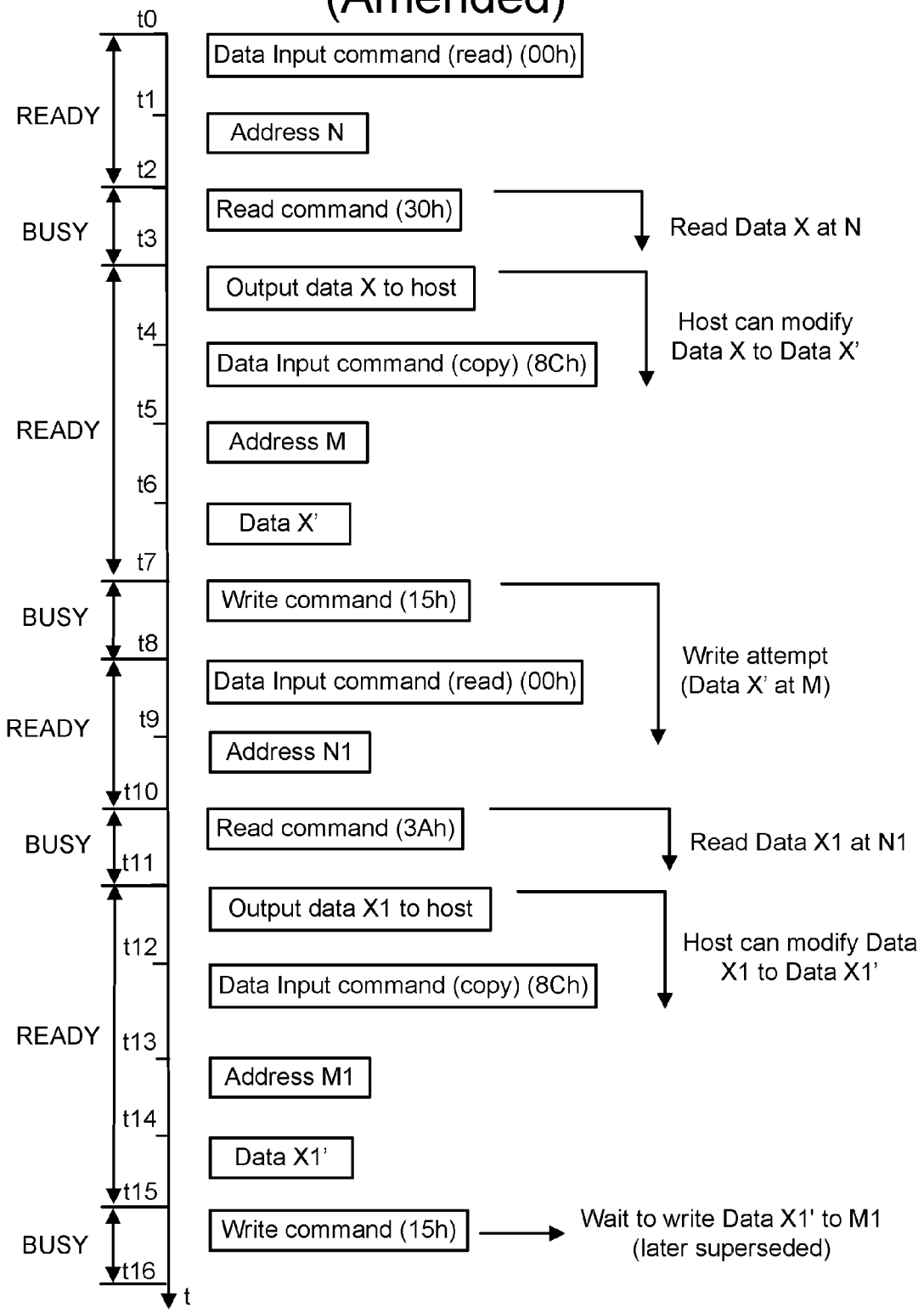

Fig. 25
(Amended)
case 4, part 2
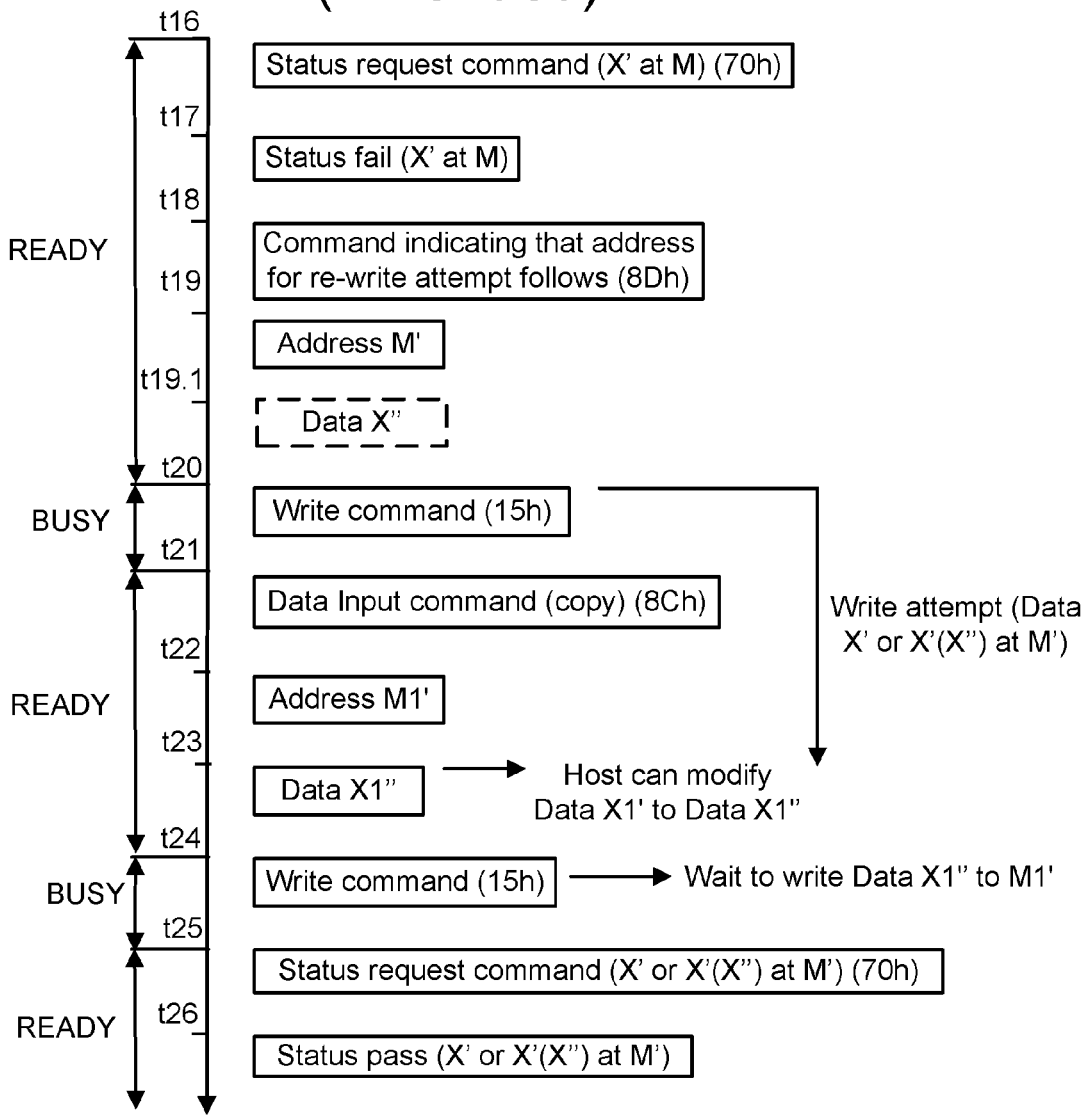

Fig. 26 (Amended)
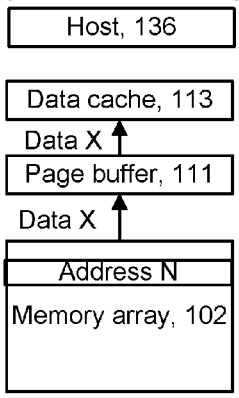
Fig. 27 (Amended)
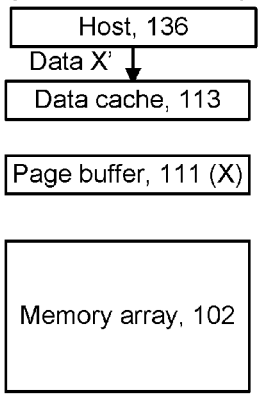
Fig. 28 case 4 (Amended)
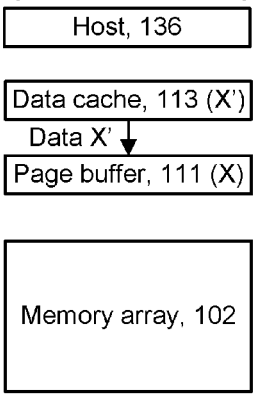
Fig. 29 (Amended)
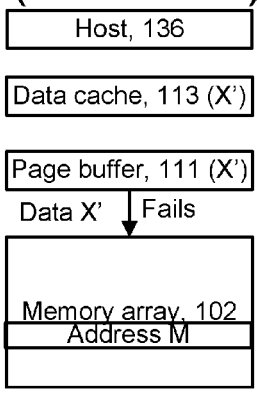
Fig. 30 (Amended)
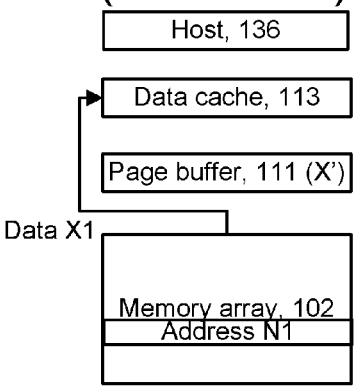
Fig. 31 (Amended)
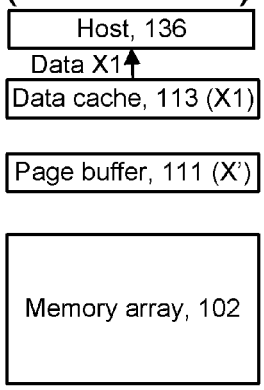
Fig. 32 (Amended)
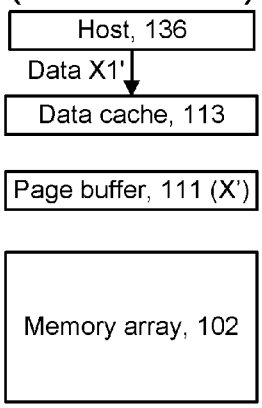
Fig. 33 (Amended)
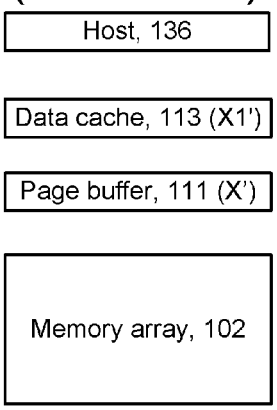
Fig. 34 (Amended)
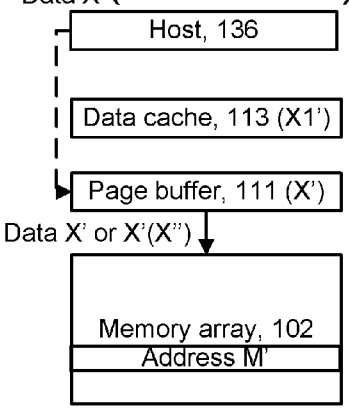

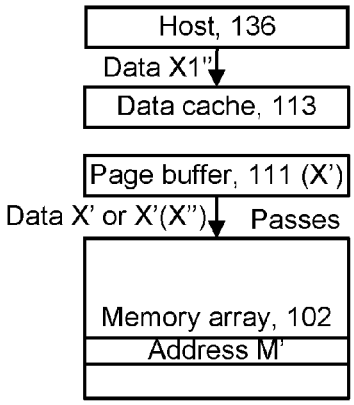
Fig. 35 (Amended)
Fig. 36 (Amended)
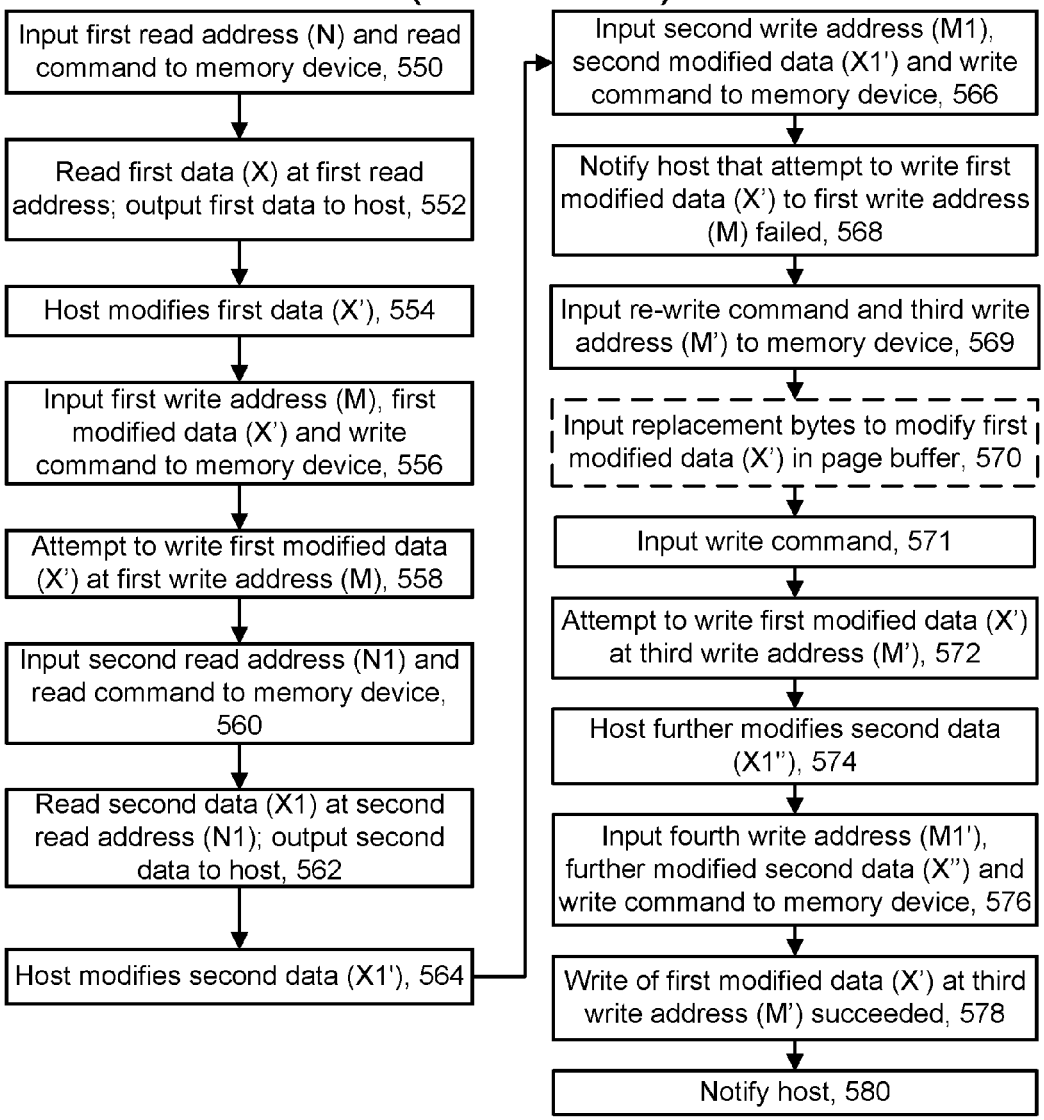

Fig. 37 (Amended)
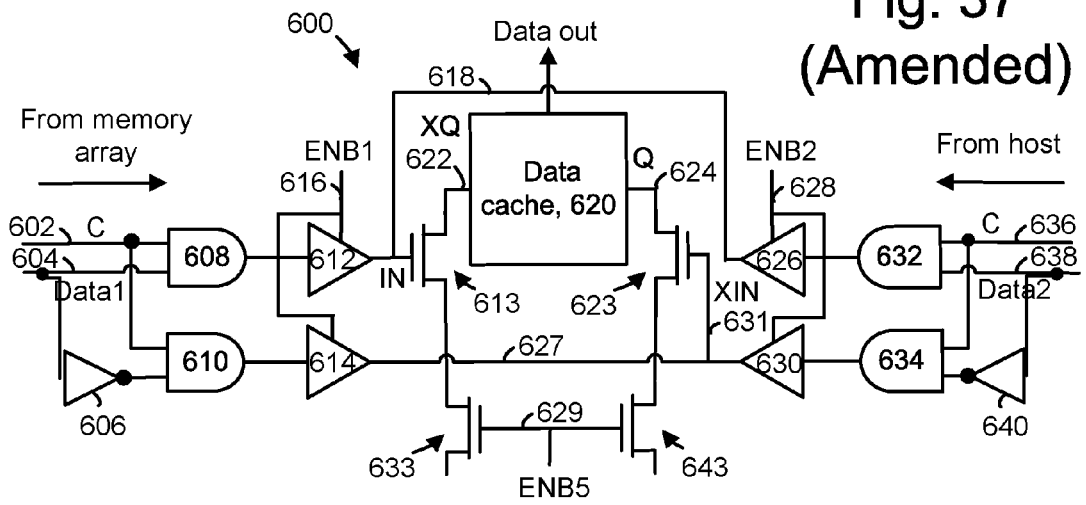
Fig. 38 (Amended)
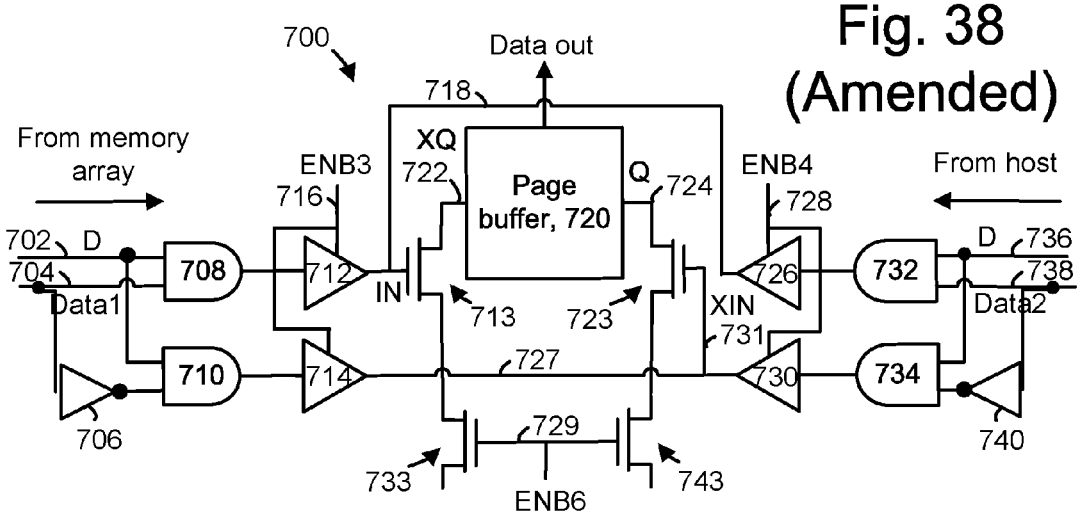
Fig. 39 (Amended)
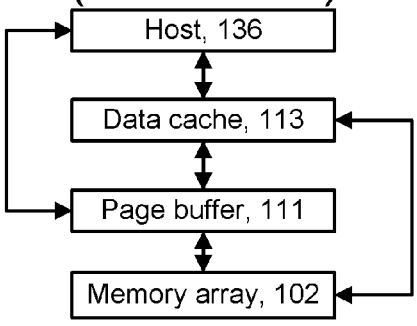

PAGE BUFFER PROGRAM COMMAND AND METHODS TO REPROGRAM PAGES WITHOUT RE-INPUTTING DATA TO A MEMORY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application claims the benefit of U.S. provisional patent application no. 61/108,507, filed Oct. 25, 2008, incorporated herein by reference.

BACKGROUND

The present invention relates to technology for data storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory such as NAND memory are among the most popular non-volatile semiconductor memories.

Non-volatile memories formed from reversible resistance-switching elements are also known. For example, U.S. Patent Application Publication 2006/0250836, published Nov. 9, 2006, and titled "Rewriteable Memory Cell Comprising A Diode And A Resistance-Switching Material," incorporated herein by reference, describes a rewriteable non-volatile memory cell that includes a diode coupled in series with a reversible resistance-switching material such as a metal oxide or metal nitride. These reversible resistance-switching materials are of interest for use in nonvolatile memory arrays. One resistance state may correspond to a data "0," for example, while the other resistance state corresponds to a data "1." Some of these materials may have more than two stable resistance states. Such switching elements are often arranged in multiple layers in so-called 3-D memory devices. Moreover, various types of volatile memory devices are known, such as DRAM. Both rewritable and write-once memories are known.

A memory device can be in the form of a card or other component which can be inserted into or otherwise connected to a host/user device, such as a host cell phone, digital camera or other device. In other cases, the memory device is permanently installed into the host device. Examples of memory devices with removable media formats are marketed under various trade names including COMPACTFLASH, SMART-MEDIA, SECURE DIGITAL, MEMORY STICK, XD-PICTURE CARD. A new generation of memory card formats with small form factors are sold under trade names including RS-MMC, MINISD AND MICROSD, AND INTELLIGENT STICK.

During a write process, a unit of data referred to as a page is written to a specified location in a memory array. For example, the host device can provide to the memory device the data which is to be written, along with an address of the memory array for writing the data. The memory device includes circuitry for writing the data to the specified address. However, when a write operation fails, such as due to a problem with the memory elements or circuitry associated with the specified address, the resulting input/output operations which attempt to resolve the failure may consume excessive bandwidth.

Techniques are needed for efficiently handling write operation failures in a memory device.

SUMMARY

A technique is provided for efficiently handling write operation failures in a memory device.

In one embodiment, a method for operating a memory device includes: (a) receiving at least one page of data and a first address at the memory device, from an external host, (b) storing the at least one page of data in a page buffer of the memory device, (c) attempting to write the at least one page of data from the page buffer to a memory array of the memory device at a location specified by the first address, (d) determining that the attempt to write the at least one page of data was unsuccessful, (e) informing the external host that the attempt to write the at least one page of data was unsuccessful, (f) receiving a second address at the memory device, from the external host, and (g) attempting to write the at least one page of data from the page buffer to the memory array at a location specified by the second address, without the external host re-sending the at least one page of data to the memory device.

In another embodiment, a method for operating a memory device includes: (a) receiving at least a first page of data and a first address at the memory device from an external host, (b) storing the at least a first page of data in a first storage location of the memory device, outside a memory array of the memory device, (c) receiving a first write command, (d) in response to the first write command, attempting to write the at least a first page of data from the first storage location to the memory array at a location specified by the first address, (e) receiving, at the memory device from the external host, a second address, (f) reading the memory array at a location specified by the second address to retrieve the at least a second page of data to a second storage location in the memory device, outside the memory array, while maintaining the at least a first page of data in the first storage location, (g) providing the at least a second page of data to the external host from the second storage location, (h) determining that the attempt to write the at least a first page of data was unsuccessful, (i) informing the external host that the attempt to write the at least a first page of data was unsuccessful, (j) receiving a second address at the memory device from the external host, and (k) attempting to write the at least a first page of data from the first storage location to the memory array at a location specified by the second address, without the external host re-sending the at least a first page of data to the memory device.

In another embodiment, a method for operating an external host of a memory device includes: (a) transmitting, from the external host to the memory device, at least one page of data, a first address, and at least a first command, where the at least a first command signals the memory device to store the at least one page of data in a page buffer of the memory device, and to attempt to write the at least one page of data from the page buffer to a memory array of the memory device at a location specified by the first address, (b) receiving, at the external host from the memory device, a status communication indicating that the attempt to write the at least one page of data at the location specified by the first address was unsuccessful, and (c) in response to the status communication, transmitting, from the external host to the memory device, a second address and at least a second command, where the at least a second command signals the memory device to attempt to write the at least one page of data from the page buffer to the memory array at a location specified by the second address, without the external host re-sending the at least one page of data to the memory device.

In another embodiment, a memory device includes a memory array of non-volatile storage elements which is formed on a substrate, a data cache, a page buffer, an interface to an external host, and one or more control circuits. The one or more control circuits: (a) receive at least one page of data and a first address, from an external host, (b) store the at least one page of data in the page buffer, (c) attempt to write the at least one page of data from the page buffer to the memory array at a location specified by the first address, (d) determine that the attempt to write the at least one page of data was unsuccessful, (e) inform the external host that the attempt to write the at least one page of data was unsuccessful, (f) receive a second address at the memory device, from the external host, and (g) attempt to write the at least one page of data from the page buffer to the memory array at a location specified by the second address, without the external host re-sending the at least one page of data to the memory device.

In another embodiment, a memory device includes a memory array of non-volatile storage elements formed on a substrate, a page buffer, a data cache, an interface to an external host, and one or more control circuits in communication with the memory array, the page buffer, the data cache and the interface. The page buffer receives first page data, and the one or more control circuits cause an attempt to be made to write the first page data from the page buffer to the memory array. Further, the data cache receives second page data from the memory array which bypasses the page buffer, while the page buffer stores the first page data. The one or more control circuits cause the second page data to be provided to the external host from the data cache. Also, the one or more control circuits cause an attempt to be made to re-write the first page data from the page buffer to the memory array.

Corresponding methods, systems and computer- or processor-readable storage devices which have executable code for performing the methods provided herein may also be provided.

Figure 1:
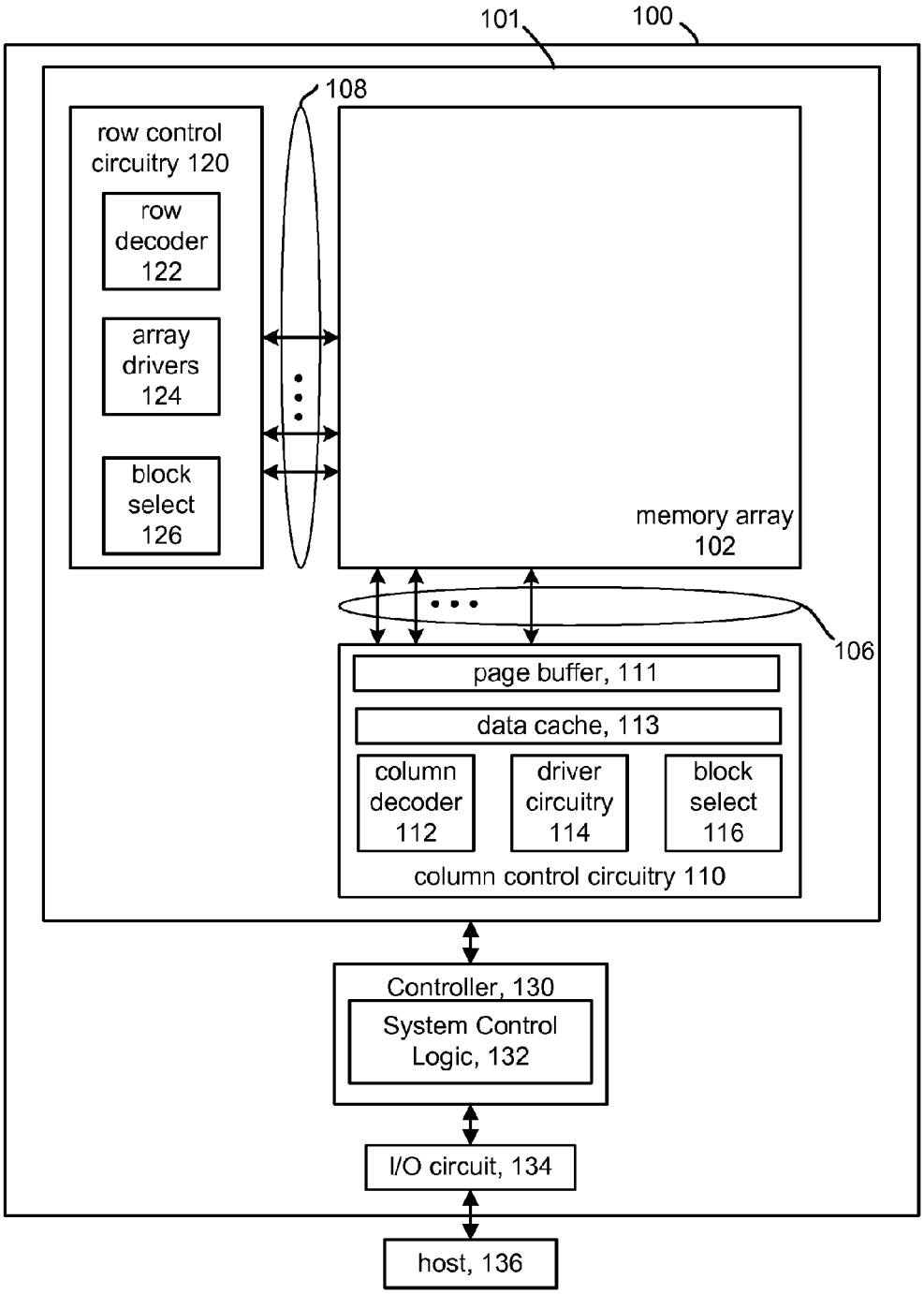
FIG. 1 is a block diagram of one embodiment of a memory system.

FIG. [2a] *2* depicts a sequence of communications between a host and a memory device in writing a page of data to a memory array.

FIGS. [2b-d] *3-5* depict movement of data in a data cache, page buffer and memory array, corresponding to the sequence of FIG. [2a] *2, where FIG. 3 shows that Data X, sent by the host 136, is stored in the data cache 113 at t2, FIG. 4 shows that, during the write process based on the write command at t3, Data X is transferred from the data cache 113 to the page buffer 111, and FIG. 5 shows that, during the re-write process based on the write command at t8, Data X is written from the page buffer 111 to address N' of the memory array 102.*

FIG. [2e] *6* depicts a process which corresponds to the sequence of FIG. [2a] *2*.

FIG. [2f] *7* depicts a host-side process which corresponds to the process of FIG. [2e] *6*.

FIG. [3a] *8* depicts a sequence of communications between a host and a memory device in writing a page of data to a memory array while receiving another page of data in a data cache.

FIGS. [3b-h] *9-15* depict movement of data in a data cache, page buffer and memory array, corresponding to the sequence of FIG. [3a] *8, where FIG. 9 shows that Data X is sent by the host 136 and stored in the data cache 113 at t2, FIG. 10 shows that during the write process based on the write command at t3, Data X is transferred from the data cache 113 to the page buffer 111, FIG. 11 shows that during the write process, Data Y is received at the cache at t6, and the write attempt for Data X fails, FIG. 12 shows that Data Y is in the data cache and Data X is in the page buffer (t8), FIG. 13 shows that Data X begins to be re-written at address N' based on the write command at t12, FIG. 14 shows that the re-write process continues and the attempt passes, and FIG. 15 shows that Data Y' is transferred to the page buffer from the data cache.*

FIG. [3i] *16* depicts a process which corresponds to the sequence of FIG. [3a] *8*.

FIG. [4a] *17* depicts a sequence of communications between a host and a memory device in writing a page of data to a memory array, where the page was copied from the memory array.

FIGS. [4b-f] *18-22* depict movement of data in a data cache, page buffer and memory array, corresponding to the sequence of FIG. [4a] *17, where FIG. 18 shows that Data X is read, based on the read command at t2, FIG. 19 shows that Data X is output to the host 136 at t3, FIG. 20 shows that the modified data, Data X', is received by the data cache, at t6, FIG. 21 shows that Data X' is copied to the page buffer and an attempt is made to write it to the memory array at address M, and FIG. 22 shows that Data X' is successfully written to the memory array at the alternative address M'.*

FIG. [4g] *23* depicts a process which corresponds to the sequence of FIG. [4a] *17*.

FIG. [5a] *24* depicts a first portion of a sequence of communications between a host and a memory device in writing a page of data to a memory array (where the page was copied from the memory array) while receiving another page of data in a data cache.

FIG. [5b] *25* depicts a second portion of a sequence of communications which follows the sequence of FIG. [5a] *24*.

FIGS. [5c-l] *26-35* depict movement of data in a data cache, page buffer and memory array, corresponding to the sequence of FIGS. [5a] *24* and [5b] *25, where FIG. 26 shows that the reading of Data X from address N involves the data being loaded in the page buffer 111 and copied to the data cache 113, FIG. 27 shows that modified data, Data X', is received from the host 136 at the data cache, FIG. 28 shows that Data X' is provided to the page buffer 111 from the page cache 113, overwriting Data X, FIG. 29 shows that an attempt is made to write Data X' from the page buffer 111 to the memory array at address M, FIG. 30 shows that Data X1 is read from the memory array at address N1 directly to the data cache 113, FIG. 31 shows that Data X1 is output from the data cache, FIG. 32 shows that modified data X1' is received at the data cache 113, FIG. 33 shows that Data X1' is in the data cache and Data X' is in the page buffer, FIG. 34 shows that a rewrite attempt occurs for Data X' at*

*address M', and FIG. 35 shows that concurrently with re-writing Data X' or X'(X"), additional data X1" is received at the data cache.*

FIG. [5m] *36* depicts a process which corresponds to the sequence of FIGS. [5a] *24* and [5b] *25*.

FIG. [6] *37* depicts a circuit in which a data cache is connected to receive data directly from a memory array or host.

FIG. [7] *38* depicts a circuit in which a page buffer is connected to receive data directly from a memory array or host.

FIG. [8] *39* depicts a functionality provided by the circuits of FIGS. [6] *37* and [7] *28*.

DETAILED DESCRIPTION

A technique is provided for efficiently handling write operation failures in a memory device.

FIG. 1 is a block diagram that depicts one example of a memory system that can implement the technology described herein. The memory system includes a memory device 100 which may be configured as a card or other package which includes a portion 101 formed on a die and a controller 130 which communicates with an external host 136 via an input-output circuit or interface 134, in one possible approach. The controller 130 includes system control logic 132 for implementing the functionality described herein. The controller 130 could be embedded in the portion 101 or off-chip, as depicted.

The memory array 102 can be a two or three dimensional array of memory cells, also referred to as storage elements. In one implementation, memory array 102 is a monolithic three dimensional memory array. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

In another possible implementation, the memory array is a two-dimensional array of non-volatile storage elements which are series-connected in strings, such as NAND strings. Each string extends in a column between drain- and source-side select gates. Word lines communicate with control gates of the storage elements in rows. Bit lines communicate with the drain end of each string, and sensing components are coupled to the bit lines to determine whether a selected storage element is in a conductive or non-conductive state.

The array terminal lines of memory array 102 include the various layer(s) of word lines organized as rows, and the various layer(s) of bit lines organized as columns. However, other orientations can also be implemented.

Memory system 100 includes row control circuitry 120, whose outputs 108 are connected to respective word lines of the memory array 102. Row control circuitry 120 receives a group of row address signals and one or more various control signals from system control logic circuit 130, and typically may include such circuits as row decoders 122, array terminal drivers 124, and block select circuitry 126 for both read and programming operations. Memory system 100 also includes column control circuitry 110 whose input/outputs 106 are connected to respective bit lines of the memory array 102. Column control circuitry 110 receives a group of column address signals and one or more various control signals from system control logic 132, and typically may include such circuits as column decoders 112, array terminal receivers or drivers 114, block select circuitry 116, as well as read/write circuitry, and I/O multiplexers. System control logic 132 receives data and commands from the host 136 and provides output data to the host. In other embodiments, system control logic 132 receives data and commands from a separate controller circuit and provides output data to that controller circuit, with the controller circuit communicating with the host. System control logic 132 may include one or more state machines, registers and other control logic for controlling the operation of the memory system 100 as described herein.

The column control circuitry 110 also includes a page buffer 111 and a data cache 113, which may be part of a sense amplifier. The page buffer is a storage location which stores data which is written into or read from the memory array, and may also retain program verification results during a write operation. One or more page buffers may be used. A page buffer can store one or more pages of data. When a word line stores only one page of data, a page buffer which only stores one page of data is sufficient. When a word line stores multiple pages of data, one or more page buffers which can store the one or more pages of data can be provided. The page buffer 111 is connected to the bit lines and to supply line voltages for read, verify, program (write), and erase operations. Regarding program verification, after a word line of storage elements in the memory array is programmed with the data stored in the page buffer 111, the word line is read back, and the read data is compared with the data stored in the page buffer. A mismatch indicates that a defect (or some other type of error) is present on the word line, and the data should be re-written to another word line. For further information, refer, e.g., to U.S. Pat. No. 7,317,636, incorporated herein by reference.

In another possible approach, instead of using a separate read operation to determine if the contents of a word line match that of the page buffer on a word-line-by-word-line basis, the programmed/unprogrammed state of each memory cell can be sensed while attempting to program the memory cell. This sensing-while-programming technique is described in detail in U.S. Pat. No. 6,574,145, titled "Memory device and method for sensing while programming a non-volatile memory cell," incorporated herein by reference.

The data cache 113 holds data which is read by the page buffer, in a read operation, and data which is to be provided to the page buffer for a write operation. As described further below, the external host, which is off the die 101, sends commands and data to the memory device 100, where the data is stored using a combination of the data cache and the page buffer as first and second storage locations. Advantageously, data which is to be written to the memory array can be maintained in the memory device after a write attempt fails at one address in the memory array and re-written to another address in the memory array without the host re-inputting the data to the memory device. Further, this re-write capability can be achieved in different scenarios, such as a scenario where additional data is receiving in the memory device while a re-write process occurs, a scenario where the re-written data is copied (and optionally modified) from one location in the memory array to another, and a scenario where additional data is receiving in the memory device while a re-write process occurs and the re-written data is copied (and optionally modified) from one location in the memory array to another. This page-based re-write capability can be distinguished from techniques which are performed by the memory device to modify a portion of a page, such as a few bytes, e.g., using error correction.

In one embodiment, all of the components depicted in FIG. 1 are arranged on a single integrated circuit. For example, system control logic 132, column control circuitry 110 and row control circuitry 120 are formed on the surface of a substrate. Moreover, memory array 102 can be a monolithic three dimensional memory array formed above the substrate (and, therefore, above system control logic 132, column control circuitry 110 and row control circuitry 120). In some cases, a portion of the control circuitry can be formed on the same layers as some of the memory array.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more memory arrays. The controller 130 and any of the other components, besides the memory array 102, may be considered to be control circuits.

As mentioned at the outset, when a write operation fails, the resulting input/output operations may consume excessive bandwidth, in terms of processor cycles used in the memory device as well as the amount of data which is transferred to the memory device. For example, a page of data may contain, e.g., 2 KB or 4 KB of data. Typically, when a write process fails, the memory device notifies the external host when the host polls the status, and the host responds by issuing a new write command and re-sending the page of data to the memory device. This host may poll every page after programming in order to find out if each page has been successfully programmed.

Specifically, in the interface of a memory card or other media format, a failed page write attempt typically needs to be remapped to another physical location in the memory array. The host typically checks the status after programming and restarts the write sequence by writing the new address and re-sending the page of data. This is especially inefficient when programming is done with data cache, which overlaps the I/O with internal operations.

A technique provided herein addresses the need to re-write failed pages to another physical location in a memory array while avoiding the need to re-input the page data. It allows the host/user to input another physical address and program the data that has been buffered in the memory device to be written to the new location. It can be used in programming in single page or with data cache, and it can be used in page copy operation (single page or cached) as well. The technique is compatible with memory systems which use a limited vocabulary of command codes, such as to avoid complexity, and due to the need for standardization and compatibility with different host devices. This significantly reduces the bandwidth penalty for programming, especially during programming with data cache mode. As a result, the write speed performance can be significantly improved.

In one implementation, the technique introduces a new setup command in the interface protocol. By using this command and sending a new address, the host can program the memory device without resending the page data, which resides in the page buffer. Only a slight modification to an existing program flow is required.

FIG. [2a] *2* depicts a sequence of communications between a host and a memory device in writing a page of data to a memory array. In this scenario, a page of data is re-written without inputting other data, and the data is not copied from another location in the memory array. A time line depicts a sequence of messages which are sent from the host to the memory device, and from the memory device to the host. The status of a READY/BUSY line of the memory device which is monitored by the host is also provided. When the status is READY, the host can communicate with the memory device, such as to request the status of a previous write operation or to provide user data and an address to the memory device. When the status is BUSY, the host has to wait to communicate with the memory device for any needs other than checking the READY/BUSY status of the device or resetting the device.

Moreover, the time points t0, t1, t2, . . . are not equally spaced in time and are meant to depict a sequence of events. In some implementations, a page buffer program command (8Dh) is introduced to save I/O time when a write process fails on a page. When this happens, the host tries to rewrite the same page to another physical location in the memory array, such as another word line, or another page on a word line having multiple pages. A write from the page buffer to another page in memory can be achieved with this new command. The user data communicated between the host and the memory device is in units of pages; one or multiple pages at a time.

Note that example command codes (e.g., 8Dh, 10h, 70h) are mentioned which are suitable for a particular implementation which involve the SMARTMEDIA non-volatile memory card. However, these command codes are provided as an illustration only, as the concepts are generally suitable for different media formats and protocols.

In a single page program process, a data input command (80h) is provided from the host to the memory device at t0, followed by an address N at t1 and one or more pages of user data to be written (Data X) at t2. The memory device keeps the address N in a working memory and stores Data X in the data cache 113 (FIG. 1). The host provides a write command (10h) at t3. Command 10h indicates that no additional page of data follows the current page. In response, the memory device copies data X to the page buffer 111 (FIG. 1), then initiates a write operation to write Data X to address N of the memory array. Conceivably, a direct path could be provided between the data cache and memory array so that the data could be written directly to the memory array from the cache without being copied to the page buffer, or the data could be read directly from the memory array to the cache without passing through the page buffer. See FIGS. 6-8 for more information. Generally, a write process is carried out automatically by the memory device without receiving further instructions from the host for carrying out the write command. That is, the memory device performs a write autonomously from the host.

At this time, the BUSY status is set. At t4, the READY status is set, in response to which the host provides a status request command (70h). Specifically, when the READY/BUSY signal rises to indicate the READY status, the host polls the memory device for the status. The memory device responds with a status fail message, for instance, at t5.

In response, the host provides a command (8Dh) at t6 which signals to the memory device that a re-write attempt is to be made with the data for which the write process has failed, and that an address for performing this re-write will follow. The new address N' is provided by the host at t7, followed by the write command (10h) at t8. Thus, first and second instances of a first write command code are provided at t3 and t8, respectively. However, the memory device understands that the instance at t8 will be interpreted differently than the instance at t3 because the instance at t8 is preceded by an instance of a second command code at t6.

Optionally, at t7.1, modified data for Data X, referred to as Data X' is communicated by the host. For example, Data X' can include a few bytes of data which replace bytes in Data X while it is in the page buffer. Thus, we can modify the page buffer data in place before re-writing it to the memory array. This can be useful in different scenarios such as when the page data depends on the address in the memory array to which it is written. The address N' can include bytes which identify the portion of Data X which is to be replaced by Data X' as well as bytes which identify the memory array address N'. The 8Dh write comman is interpreted to write Data X' directly to the page buffer.

At t8, the memory device attempts to write Data X, optionally as modified by X' (denoted X(X')), to a location in the memory array which is specified by address N', and a BUSY status is set. Specifically, when the READY/BUSY signal lowers to indicate the BUSY status, the write operation occurs. At t9, the READY status is set, in response to which the host provides a second instance of the status request command (70h). Specifically, when the READY/BUSY signal rises to indicate the READY status, the host polls the memory device for the status. The memory device responds with a status pass message, for instance, at t10.

FIGS. [2b-c] *3-4* depict movement of data in a data cache, page buffer and memory array, corresponding to the sequence of FIG. [2a] *2*. At FIG. [2b] *3*, Data X, sent by the host 136, is stored in the data cache 113 at t2. At FIG. [2c] *4*, during the write process based on the write command at t3, Data X is transferred from the data cache 113 to the page buffer 111 and a failed attempt is made to write it from the page buffer 111 to address N of the memory array 102. At FIG. [2d] *5*, during the re-write process based on the write command at t8, Data X is written from the page buffer 111 to address N' of the memory array 102, resulting in a success. Optionally, as mentioned, the host 136 can provide Data X' directly to the page buffer 111 to replace a portion of Data X, providing modified Data X(X'), which is written to address N' of the memory array 102. See FIGS. 6-8 for further details of a circuit which provides a direct host-to-page buffer communication capability.

FIG. [2e] *6* depicts a process which corresponds to the sequence of FIG. [2a] *2*. Step 250 includes inputting user data, a first address and a write command to a memory device. Step 252 includes attempting to write the data using the first address. Decision step 254 determines if the write attempt has passed. If it has passed, the process ends at step 264. Step 256 includes notifying the host that the write attempt has not passed. Step 257 includes inputting a re-write command and a second address. Step 258 optionally includes inputting replacement bytes to modify the data which is in a page buffer. Step 259 inputs a write command. Step 260 includes attempting to write the data using the second address. Step 262 indicates to the host that the rewrite attempt has passed. The process ends at step 264.

FIG. [2f] *7* depicts a host-side process which corresponds to the process of FIG. [2e] *6*. Step 270 includes transmitting user data, a first address and a write command to a memory device. Step 272 includes receiving a notification that the write attempt has failed. Step 273 includes transmitting a re-write command and a second address. Step 274 optionally includes transmitting replacement bytes to modify the data which is in a page buffer. Step 275 transmits a write command. Step 276 includes receiving a notification that the write attempt has passed. The process ends at step 278.

FIG. [3a] *8* depicts a sequence of communications between a host and a memory device in writing a page of data to a memory array while receiving another page of data in a data cache. This sequence allows additional data to be received and stored at the memory device while a write request for earlier data is pending. During this cache-program sequence, the 8Dh command can be used after a status failure is detected for a page write. In this case, after the program operation, a copy from the data cache to the page buffer does not happen, as it would with a successfully programmed page. The 8Dh command can be issued, followed by a new page address and the cache program command (e.g., 15h). Command 15h indicates that an additional page of data is received and goes into data cache, at the same time the current page is being written to the memory array.

In this case the page data is programmed to the new address. To skip the remapping, the cache sequence is resumed directly. To resume the cache sequence, an 80h command and page address for the subsequent page are reissued. Note that the 80h command does not automatically set the bytes in the data cache in this case. In a normal program operation without failure before the user starts to input the data, all previous data in the cache is set to FF (11111111). This is because the write was successful and the old data has already been stored in the memory. In case of a failure, the data in the cache is the data still to be programmed. We want the data to stay there and allow the user/host to decide whether to modify the data or keep it there.

A data input command (80h) is provided from the host to the memory device at t0, followed by an address N at t1 and user data to be written (Data X) at t2. The memory device keeps the address N in a working memory and stores Data X in the data cache 113 (FIG. 1). The host provides a write command (15h) at t3, assuming any previous page which was written has successfully been written. In response, the memory device initiates a write operation to write Data X to address N of the memory array. Note that this can occur concurrently with additional communications between the host and the memory device.

At t3, the BUSY status is set. At t4, the READY status is set, in response to which the host provides the data input command, followed by an address M at t5 and Data Y at t6. Data Y is stored in the data cache. Thus, additional data is input to the memory device while a write attempt is made for data X. This provides an efficient use of bandwidth. A write command for writing data Y is provided at t7, but implementation of this command must wait until the previous data has been successfully written. This write command is later superseded by a write command for Y' at t16. The host waits for the READY signal. At t8, the READY status is set, in response to which the host polls the memory device for the status of the data X write attempt. The memory device responds with a status fail message, for instance, at t9. There is no data copy from data cache to page buffer, otherwise the data for the page that failed would be overridden. The memory stops and wait for either an 8D command—retry to program data in page buffer—or 80 command—ignore the fail, override that data in the page buffer (which contained the failed page) and copy data from data cache to page buffer to restart the cache operation.

In response to the status fail communication at t9, the host provides a command (8Dh) at t10 which signals to the memory device that a re-write attempt is to be made with the data for which the write process has failed, and that an address for performing this re-write will follow. The new address N' is provided by the host at t11, followed by the write command (15h) at t12.

Optionally, at t11.1, modified data for Data X, referred to as Data X' is communicated by the host, as discussed, to modify a portion of Data X which is in the page buffer. We can modify the page buffer data in place before re-writing it to the memory array. The address N' can include bytes which identify the portion of Data X which is to be replaced by Data X' as well as bytes which identify the memory array address N'.

The READY/BUSY signal is set to BUSY at t12, then to READY at t13. Again, the memory device understands that the write command at t12 will be interpreted as a re-write from the page buffer because it is preceded by the command at t10. An attempt is made to write Data X or X(X') to address N' at t12.

At this point, the host knows that a re-write attempt needs to be carried out by the memory device. The host has the option to provide modified data Y' to be stored in the memory device in place of the previously sent data Y. Further, a new address M' for storing Data Y' can be selected. For example, Data Y may be modified based on the new address M' at which the re-write will be attempted. Data Y might contain information which refers to the location of Data X in the memory array, in which case Data Y can be modified based on the new location of Data X. For example data Y could contain data that points to the address of data x. This data has to be modified. While it is unlikely, it is possible. Also, in response to a page failure, different data might be required in the following page write (different data might also be required for the failed page). An example of this is a "linked list" structure in which the pages are arranged in a chain, even though their physical addresses are not contiguous. Instead, each page contains the address of its predecessor so the software or firmware can keep track of the entire chain. In the case that data X's location changes from N to N', data Y must update its portion of address for X, from N to N'. If Data Y is not modified, it can remain in the data cache.

The host can choose to provide a data input command at t13 followed by the modified address M' at t14, the modified Data Y' at t15 and a new write command for Data Y' at t16, and the READY/BUSY signal goes to BUSY. The host could begin modifying Data Y to Data Y' when the status fail is received at t9. However, for efficiency, when the host issues the 8Dh command, address N' and Data X', then issues the next 10h/15h command before it goes to modify Data Y, then modifying Data Y can be done in parallel with Data X or X(X') being written. If the host does not intend to modify Data Y, data cycles can be skipped. Moreover, even if the user does not intend to change address M, address cycles are still needed: in this case, the host re-inputs address M.

This write command waits to be implemented because the write of Data X has not yet been confirmed. At t17, Data X or X(X') at address N' successfully finishes programming, the READY/BUSY signal rises to indicate the READY status, and the host polls the memory device for the status. The memory device responds with the write status for Data X or X(X') with a status pass message at t18. Subsequently, Data Y' is written to the memory array at address M'.

The host can issue another data input command (not shown) for a next page of data to be written to the memory array, and the cache write process continues.

Note that the re-write command at t10 can be skipped if the host chooses to ignore the failure notification at t9. In this case, a copy from data cache to page buffer can happen after the 15h command is issued at t16.

FIGS. [3b-h] *9-15* depict movement of data in a data cache, page buffer and memory array, corresponding to the sequence of FIG. [3a] *8*. At FIG. [3b] *9*, Data X is sent by the host 136 and stored in the data cache 113 at t2. At FIG. [3c] *10*, during the write process based on the write command at t3, Data X is transferred from the data cache 113 to the page buffer 111 and begins to be written from the page buffer 111 to address N of the memory array 102. At FIG. [3d] *11*, during the write process, Data Y is received at the cache at t6, and the write attempt for Data X fails. At FIG. [3e] *12*, Data Y is in the data cache and Data X is in the page buffer (t8). At FIG. [3f] *13*, Data X begins to be re-written at address N' based on the write command at t12. Optionally, as mentioned, the host 136 can provide Data X' directly to the page buffer 111 to replace a portion of Data X, providing modified Data X(X'), which is written to address N' of the memory array 102. At FIG. [3g] *14*, the re-write process continues and the attempt passes. Also, concurrently, modified Data Y' is stored at the data cache at t15. At FIG. [3h] *15*, Data Y' is transferred to the page buffer from the data cache (after t18, not shown).

FIG. [3i] *16* depicts a process which corresponds to the sequence of FIG. [3a] *8*. Step 350 includes inputting first user data, a first address and a write command to a memory device. Step 352 includes attempting to write the first data using the first address. Step 354 includes inputting second data, a second address and a write command to the memory device. Decision step 356 determines if the write attempt of the first data has passed. If it has passed, the process continues at step 370 as we continue with the data cache flow. Step 358 includes notifying the host that the write attempt of the first data has not passed.

Step 360 includes inputting a re-write command and a third address. Step 362 optionally includes transmitting replacement bytes to modify the first data (X) which is in a page buffer. Step 363 inputs a write command Step 364 includes attempting to write the (optionally modified) first data using the third address. Recall that the host can modify the second data at this time to provide Data Y'. Steps 362-364 can be skipped if the user chooses to do so. Step 366 includes inputting the modified second data, e.g., only few bytes can be modified, a fourth address and a write command to the memory device. Step 368 includes notifying the host that the rewrite attempt of the first data has passed. After step 366, the host waits for the READY/BUSY signal, which stays low (BUSY) until programming of Data X or X(X')is completed. The process continues at step 370.

FIG. [4a] *17* depicts a sequence of communications between a host and a memory device in writing a page of data to a memory array, where the page was copied from the memory array. This sequence allows data to be copied from the memory array, optionally modified, and written back to the memory array. During a page copy sequence, a status failure can be followed by the 8Dh command and a new page address and the program command (e.g., 10h) again. The result is to program the same page of data into the new page location.

A read data input command (00h) is provided from the host to the memory device at t0, followed by an address N at t1 and a read command (30h) at t2, in response to which Data X at address N is read. At t2, the READY/BUSY signal goes to BUSY and a page of data at address N is loaded into the page buffer, then copied into the cache. Data X is output from the data cache to the host at t3 when the READY/BUSY signal goes to READY. Data X can be toggled out.

The host has the option to modify Data X before it is copied/written back to the memory array. At t4, the host provides a copy data input command (8Ch), followed by an address M at t5 and the modified data, Data X', at t6. In response to a write command (10h) at t7, an attempt is made to write Data X' at address M. Specifically, at t7, the READY/BUSY signal goes to BUSY, and Data X' is copied from the data cache to the page buffer, then written to the physical location specified by M in the memory array. At t8, the READY/BUSY signal rises to indicate the READY status, and the host polls the memory device for the status. The memory device responds with the write status for Data X' with a status fail message, for instance, at t9.

In response to the status fail communication, the host provides a command (8Dh) at t10 which signals to the memory device that a re-write attempt is to be made with the data for which the write process has failed, and which is still in the page buffer, and that an address for performing this re-write will follow. The new address M' is provided by the host at t11, followed by the write command (10h) at t12. Again, the memory device understands that the write command at t12 will be interpreted as a re-write from the page buffer because it is preceded by the command at t10. Optionally, at t11.1, modified data for Data X', referred to as Data X" is communicated by the host, as discussed, to modify a portion of Data X' which is in the page buffer. Thus, we can modify the page buffer data in place before re-writing it to the memory array. The address M' can includes bytes which identify the portion of Data X which is to be replaced by Data X' as well as bytes which identify the memory array address M'.

At t12, the READY/BUSY signal goes to BUSY, and Data X' or X'(X") in the page buffer is successfully written to the physical location specified by M' in the memory array. At t13, the READY/BUSY signal rises to indicate the READY status, in response to which a status request command is provided by the host which relates to the attempted write of Data X' or X'(X") to address M'. A status pass message is provided to the host by the memory device at t14.

FIGS. [4b-f] *18-22* depict movement of data in a data cache, page buffer and memory array, corresponding to the sequence of FIG. [4a] *17*. In FIG. [4b] *18*, Data X is read, based on the read command at t2. Data X is loaded to the page buffer from the memory array, and to the data cache from the page buffer. In FIG. [4c] *19*, Data X is output to the host 136 at t3. A copy of Data X can remain in the page buffer 111. At FIG. [4d] *20*, the modified data, Data X', is received by the data cache, at t6. At FIG. [4e] *21*, responsive to the write command at t7, Data X' is copied to the page buffer and an attempt is made to write it to the memory array at address M, which fails. At FIG. [4f] *22*, responsive to the write command at t12, Data X' is successfully written to the memory array at the alternative address M'. Optionally, as mentioned, the host 136 can provide Data X" directly to the page buffer 111 to replace a portion of Data X', providing modified Data X'(X"), which is written to address M' of the memory array 102.

FIG. [4g] *23* depicts a process which corresponds to the sequence of FIG. [4a] *17*. Step 450 includes inputting a first read address and a read command to the memory device. Step 452 includes reading the first data at the first read address and outputting the data to the host. At step 454, the host optionally modifies the first data. Step 456 includes inputting a first write address, the modified data and a write command to the memory device. Step 458 includes attempting to write the modified data using the first write address. At decision step 460, if the attempted write passes, the process ends at step 468.

At decision step 460, if the attempted write does not pass, the host is notified at step 462. Step 463 includes inputting a re-write command and a second write address. Step 464 optionally includes transmitting replacement bytes to further modify the modified data (X') which is in a page buffer. Step 465 inputs a write command. Step 466 includes attempting to write the (optionally further modified) modified data X' or X'(X") using the second write address. The process ends at step 468.

FIG. [5a] *24* depicts a first portion of a sequence of communications between a host and a memory device in writing a page of data to a memory array, where the page was copied from the memory array, while receiving another page of data in a data cache. This sequence allows data to be copied from the memory array, optionally modified, and written back to the memory array, while also receiving additional data.

In a page copy with data cache sequence, if a page program failed, then similar to the cache program case, the data in the data cache will not be copied to the page buffer. The host in this case can use the 8Dh command to program the failed page into another address, or ignore the failed page to continue with the sequence. To program the failed page into another address, the host sends the 8Dh command, followed by the new page address and the cache program command (e.g., 15h). To ignore the failed page, the host directly goes to the next step to resume the cache-copy sequence: the 8Ch command followed by the subsequent page's address (modification allowed) and possibly data byte modifications, then the cache program command intended for the subsequent page is input to the memory device.

A read data input command (00h) is provided from the host to the memory device at t0, followed by an address N at t1 and a read command (30h) at t2, in response to which Data X at address N is read. Specifically, at t2, the READY/BUSY signal goes to BUSY, and Data X is loaded into the page buffer and then copied to the data cache. Data X is output to the host at t3 when the READY/BUSY signal goes to READY. The host has the option to modified Data X before it is copied/written back to the memory array. At t4, the host provides a copy data input command (8Ch), followed by an address M at t5 and the modified data, Data X', at t6. In response to a write command (15h) at t7, an attempt is made to write Data X' at address M. Specifically, the READY/BUSY signal goes to BUSY, and Data X' is copied from the data cache to the page buffer, then written to location M in the memory array. At t8, the READY/BUSY signal rises to indicate the READY status, and the host initiates another read operation for additional data X1. An attempt is made to write Data X' in the page buffer to address M in the array.

A read data input command (00h) for another page to read is provided from the host to the memory device at t8, followed by an address N1 at t9 and a read command (3Ah) at t10, in response to which Data X1 at address N1 is read, as the READY/BUSY signal goes to BUSY. Data X1 is loaded into the data cache directly and output to the host at t11, so that Data X' can remain in the page buffer for a subsequent re-write attempt. See FIGS. 6-8 for further information. The host has the option to modify Data X1 before it is copied/written back to the memory array. At t12, the host provides a copy data input command (8Ch), followed by a new address M1 at t13 and the modified page of data, Data X1', at t14. A write command (15h) at t15 to write Data X1' at address M1 must wait because the prior write attempt of Data X' to address M has not yet been completed. This write command is later superseded by a write command for X1" to address M1' at t24.

FIG. [5b] *25* depicts a second portion of a sequence of communications which follows the sequence of FIG. [5a] *24*. At t16, the READY/BUSY signal rises to indicate the READY status, in response to which the host polls the memory device for the status of the data X' at address M write attempt. The memory device responds with a status fail message, for instance, at t17, which identifies the write failure of X' to M. Due to this write failure, there is no copy from data cache to the page buffer for Data X1'. In response to the status fail communication, the host provides a command (8Dh) at t18 which signals to the memory device that a re-write attempt is to be made with the data for which the write process has failed, and which is still in the page buffer, and that an address for performing this re-write will follow. The new address M' is provided by the host at t19, followed by the write command (15h) at t20. Again, the memory device understands that the write command at t20 will be interpreted as a re-write from the page buffer because it is preceded by the command at t18. At t20, the READY/BUSY signal goes to BUSY and Data X' in the page buffer starts to be written to the memory array. Optionally, at t19.1, modified data for Data X', referred to as Data X" is communicated by the host, as discussed, to modify a portion of Data X' which is in the page buffer. Thus, we can modify the page buffer data in place before re-writing it to the memory array. The address M' can include bytes which identify the portion of Data X' which is to be replaced by Data X" as well as bytes which identify the memory array address M'.

At this point, modified data X1" is provided back to the memory device. The host can modify Data X1' to Data X1". This happens right after the retry is started and the memory is ready. Specifically, a copy data input command is provided at t21, followed by a new address M1' at t22, Data X1" at t23 and a write command at t24. If the host does not intend to change Data X1' to X1", data cycles can be skipped. Moreover, even if the user does not intend to change address M1, address cycles are still needed: in this case, the host re-inputs address M1.

The write command at t24 to write Data X1" at address M1' must wait because the prior write attempt of Data X' or X'(X") has not yet been completed. Programming of Data X' or X'(X") to M' successfully finishes by t25, when a status request command is provided for the host which relates to the attempted write of Data X' or X'(X") to address M'. Data X1" is copied from data cache to the page buffer. A status pass message is provided to the host by the memory device at t26 and the sequence continues.

Note that the re-write command at t18 can be skipped if the host chooses to ignore the failure notification at t17. In this case, a copy (transfer from data cache to page buffer) can happen after the 15h command is issued at t20.

FIGS. [5c-l] *26-35* depict movement of data in a data cache, page buffer and memory array, corresponding to the sequence of FIGS. [5a] *24* and [5b] *25*. At FIG. [5c] *26*, the reading of Data X from address N involves the data being loaded in the page buffer 111 and copied to the data cache 113, at t2. At FIG. [5d] *27*, modified data, Data X', is received from the host 136 at the data cache, at t6. At FIG. [5e] *28*, based on the write command at t7, Data X' is provided to the page buffer 111 from the page cache 113, overwriting Data X. At FIG. [5f] *29*, also based on the write command at t7, an attempt is made to write Data X' from the page buffer 111 to the memory array at address M, which fails. At FIG. [5g] *30*, based on the read command at t8, Data X1 is read from the memory array at address N1 directly to the data cache 113, so that Data X' remains in the page buffer for a subsequent re-write attempt. At FIG. [5h] *31*, at t11, Data X1 is output from the data cache.

At FIG. [5i] *32*, at t14, modified data X1' is received at the data cache 113. At FIG. [5j] *33*, Data X1' is in the data cache and Data X' is in the page buffer. At FIG. [5k] *34*, based on the write command at t20 a rewrite attempt occurs for Data X' at address M'. Optionally, as mentioned, the host 136 can provide Data X" directly to the page buffer 111 to replace a portion of Data X', providing modified Data X'(X"), which is written to address M' of the memory array 102. At FIG. [5l] *35*, at t23, concurrently with re-writing Data X' or X'(X"), additional data X1" is received at the data cache. Thus, we have at least partially overlapping operations in which data which is read out from the memory array, modified and stored back into the memory array, in the form of Data X and Data X1.

FIG. [5m] *36* depicts a process which corresponds to the sequence of FIGS. [5a] *24* and [5b] *25*. Step 550 includes inputting a first read address and a read command to the memory device. Step 552 includes reading first data at the first read address and outputting it to the host. At step 554, the host optionally modifies the first data to provide X'. Step 556 includes inputting a first write address, the first modified data and a write command to the memory device. Step 558 includes attempting to write the first modified data at the first write address. Step 560 includes inputting a second read address and a read command to the memory device. Step 562 includes reading second data at the second read address and outputting it to the host. At step 564, the host optionally modifies the second data. Step 566 includes inputting a second write address, the second modified data and a write command to the memory device. Step 568 includes notifying the host that the attempt to write the first modified data to the first write address failed. Step 569 includes inputting a re-write command followed by a third write address. Step 570 optionally includes transmitting replacement bytes to further modify the first modified data (X') which is in a page buffer. Step 571 inputs a write command. Step 572 includes attempting to write the (optionally further modified) first modified data at the third write address. At step 574, the host optionally further modifies the second data to provide X1'. Step 576 includes inputting a fourth write address, the further modified second data and a write command to the memory device. At step 578, the write attempt of the first modified data to the third write address succeeded, and at step 580, the host is notified accordingly.

As the above discussion indicates, the 8Dh command is used after a page program fails. To use this feature, the host checks the status after every programmed page. When programming of a page fails during a cache operation, a copy from the data cache to the page buffer is halted. The host can then: (a) use the 8Dh command sequence (8Dh->new address->(optional) new data->(cache) program command) to remap the data in the data buffer, or (b) skip the remapping and do nothing. In either case, the host can continue as follows. First, in single page mode, if (a) is chosen, wait for the READY/BUSY signal to go to READY again. Second, in cache mode, the command sequence for the subsequent page (80h-address-data-program command) is repeated to resume the cache flow. In this case, address and data can be modified from the original flow. Then, wait for READY/BUSY signal to go to READY again. After this step, the host should check the status if (a) was chosen. If the status is another fail, then the host can choose to select another page location by using the 8Dh command again, or skip the remapping, similar to the above flow. A retry limit (maximum number of remappings allowed) can be used to avoid an infinite loop.

FIG. [6] *37* depicts a circuit 600 in which a data cache 620 is connected to receive data directly from a memory array or host. Data can be output from the data cache to the memory array or host as well using appropriate circuitry via a "Data out" path. As mentioned previously, data can be loaded into the data cache directly from the memory array, bypassing the page buffer, and output to the host so that other data can remain in the page buffer for a subsequent re-write attempt. This also allows the host to modify the failed page which is located in the page buffer by bypassing the data cache and directly accessing the page buffer. This can be achieved, as discussed previously, using the 8Dh command followed by an address which indicates data bytes to modify in the page buffer with replacement bytes (such by providing a byte address for the starting byte to be replaced) as well as a memory array address for writing the modified page buffer data, followed by the replacement data bytes.

Generally, the data cache can be connected directly to the memory array or host, bypassing the page buffer, and the page buffer can be connected directly to the memory array or host, bypassing the data cache, with the circuitry provided herein. The implementation provided is one possibility among different possibilities.

A left hand side of the circuit interfaces with the memory array and the right hand side of the circuit interfaces with the host/user. The circuit includes the data cache 620, AND gates 608, 610, 632 and 634, inverters 606 and 640, nMOS transistors 613, 623, 633 and 643 and tri-state buffers 612, 614, 626 and 630. An input signal IN is provided at the output of the buffer 612 which communicates with line 618, at a gate of the transistor 613. An inverse signal XIN is provided at the output of the buffers 614 and 630, at a gate of the transistor 623, on line 631, which communicates with line 627. The transistors 633 and 643 receive a signal ENB5 at their gates, on line 629, and are connected to transistors 613 and 623, respectively. The enable signals are provided by one or more control circuits.

A tri-state buffer has an output port which can assume the traditional 0- and 1-levels in addition to a high impedance or floating state which effectively removes the buffer from the circuit. An enable signal ENB1 on line 616 controls buffers 612 and 614, and an enable signal ENB2 on line 628 controls buffers 626 and 630. Further, on the memory array side, a control signal C is provided on a line 602, and data from the memory array, Data1, is provided on line 604. On the host side, the control signal C is provided on a line 636, and data from the user, Data2, is provided on line 638. A line 618 connects an output of the buffer 626 to a gate of the transistor 613. Data XQ on line 622 is an inverse of data Q on line 624. The data cache 620 and the transistors 613 and 623 form a latch.

To write data from the memory array into the data cache, we set C=1, ENB1=1, ENB2=0 and ENB5=1. Setting C=1 allows the AND gate 608 to pass Data1 to the buffer 612, setting ENB1=1 allows the buffer 612 to pass Data1, and setting ENB2=0 causes the buffer 626 to float. Setting ENB5=1 allows writing data into the data cache 620.

To write data from the host into the data cache, we set C=1 to allow the AND gate 632 to pass Data2 to the buffer 626, set ENB1=0 to cause the buffer 612 to float, and set ENB2=1 to allow the buffer 626 to pass Data2. Also, ENB5=1, as before.

The data cache can be inactivated when writing to the page buffer by setting ENB1=0, ENB2=0 and ENB5=0. Setting ENB5=0 prevents the floating inputs to the transistors 613 and 623 from corrupting the data in the data cache.

FIG. [7] *38* depicts a circuit 700 in which a page buffer 720 is connected to receive data directly from a memory array or host. Data can be output from the page buffer to the memory array or host as well using appropriate circuitry via a "Data out" path. Components 702, 704, 706, 708, 710, 712, 713, 714, 716, 718, 722, 723, 724, 726, 727, 728, 729, 730, 731, 732, 733, 734, 736, 738, 740 and 743, correspond to components 602, 604, 606, 608, 610, 612, 613, 614, 616, 618, 622, 623, 624, 626, 627, 628, 629, 630, 631, 632, 633, 634, 636, 638, 640 and 643, respectively, in FIG. 6. Additionally, enable signals ENB3 and ENB4 are provided by one or more control circuits to buffers 712/714 and 726/730, respectively, and ENB6 is provided on line 729. The page buffer 720 and the transistors 713 and 723 form a latch.

To write data from the memory array into the page buffer, we set D=1 to allow the AND gate 708 to pass Data 1 to the buffer 712, set ENB3=1 to allow the buffer 712 to pass Data1, and set ENB4=0 causes the buffer 726 to float. Also, setting ENB6=1 allows writing data into the page buffer 720.

To write data from the host into the page buffer, we set D=1 to allow the AND gate 732 to pass Data2 to the buffer 726, set ENB3=0 to cause the buffer 712 to float, and set ENB4=1 to allow the buffer 726 to pass Data2. Also, ENB6=1, as before.

The page buffer can be inactivated when writing to the data cache by setting ENB3=0, ENB4=0 and ENB6=0. Setting ENB6=0 prevents the floating inputs to the transistors 713 and 723 from corrupting the data in the page buffer.

FIG. [8] *39* depicts a functionality provided by the circuits of FIGS. [6] *37* and [7] *38*. The page buffer 111 and host 136 can exchange data directly, while the page buffer 111 also communicates directly with the memory array. The page buffer and data cache 113 can also communicate. Moreover, the data cache 113 and memory array 102 can exchange data directly, while the data cache 113 also communicates with the host 136. As mentioned, this allows the ability to write or read data to/from the data cache and page buffer independently.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for operating a memory device, comprising:

receiving at least one page of data and a first address at the memory device, from an external host which is external to the memory device, the memory device comprises a memory array of storage elements on a die, and the storage elements are arranged in strings which are in communication with bit lines;

storing the at least one page of data in a data cache on the die;

storing the at least one page of data in a page buffer on the die by transferring the at least one page of data from the data cache to the page buffer, the page buffer is connected to the bit lines, and the page buffer and the data cache are part of column control circuitry on the die;

attempting to write the at least one page of data from the page buffer to the memory array at a location specified by the first address;

determining that the attempt to write the at least one page of data was unsuccessful;

informing the external host that the attempt to write the at least one page of data was unsuccessful;

receiving a second address at the memory device, from the external host; and attempting to write the at least one page of data from the page buffer to the memory array at a location specified by the second address, without the external host re-sending the at least one page of data to the memory device.

2. The method of claim 1, further comprising:

receiving replacement bytes at the memory device, from the external host;

receiving a byte address of a starting byte of data bytes of the at least one page of data in the page buffer which are to be replaced by the replacement bytes; and replacing the data bytes of the at least one page of data in the page buffer with the replacement bytes, based on the byte address of the starting byte, before the attempting to write the at least one page of data from the page buffer to the memory array at the location specified by the second address.

3. The method of claim 1, wherein:

the attempting to write the at least one page of data from the page buffer to the memory array at the location specified by the first address is performed in response to receiving an initial write command from the external host; and the attempting to write the at least one page of data from the page buffer to the memory array at the location specified by the second address, without the *external* host re-sending the at least one page of data to the memory device, is performed in response to receiving, from the external host, a page buffer program command followed by the second address, followed by an additional write command, the page buffer program command signals to the memory device that a re-write attempt is to be carried out using data in the page buffer and that an address with which the re-write attempt is to be made will follow the page buffer program command.

4. The method of claim 1, wherein:

the memory device automatically attempts to write the at least one page of data from the page buffer to the memory array at the location specified by the second address without further instruction from the external host.

5. The method of claim 1, wherein:

the transferring is performed in response to receiving an initial write command from the external host, and the attempting to write the at least one page of data from the page buffer to the memory array at the location specified by the first address is performed in response to receiving the initial write command.

6. The method of claim 1, wherein:

the attempting to write the at least one page of data from the page buffer to the memory array at the location specified by the first address is performed in response to receiving, from the external host, a first instance of a first command code which signals to the memory device to perform a write process; and the attempting to write the at least one page of data from the page buffer to the memory array at the location specified by the second address, is performed in response to receiving, from the external host, an instance of a second command code, followed by the second address, followed by a second instance of the first command code, the instance of the second command code signals to the memory device that a new address is being provided for a re-write attempt using data in the page buffer, and the second instance of the first command code signals to the memory device to perform the write process.

7. The method of claim 1, wherein:

the memory device is a 3-D memory storage medium.

8. The method of claim 1, further comprising:

receiving at least one additional page of data from the external host and storing the at least one *additional* page of data in the data cache on the die during the attempting to write the at least one page of data from the page buffer to the location in the memory array specified by the first address.

9. The method of claim 8, further comprising:

during the attempting to write the at least one page of data from the page buffer to the location in the memory array specified by the second address: receiving the at least one additional page of data from the external host, and storing the at least one additional page of data in the data cache.

10. The method of claim 1, wherein:

the at least one page of data comprises data which was read from the memory array and modified by the external host based on the second address before being received by the memory device.

11. A method for operating a memory device, comprising:

receiving at least a first page of data and a first address at the memory device from an external host which is external to the memory device, the memory device comprises a memory array of storage elements on a die, and the storage elements are arranged in strings which are in communication with bit lines;

storing the at least a first page of data in a first storage location on the die, outside the memory array, the first storage location is connected to the bit lines;

receiving a first write command;

in response to the first write command, attempting to write the at least a first page of data from the first storage location to the memory array at a location specified by the first address;

receiving, at the memory device from the external host, a second address;

reading the memory array at a location specified by the second address to retrieve at least a second page of data to a second storage location in the memory device, outside the memory array, while maintaining the at least a first page of data in the first storage location, the first storage location and the second storage location are part of column control circuitry on the die;

providing the at least a second page of data to the external host from the second storage location;

determining that the attempt to write the at least a first page of data was unsuccessful;

informing the external host that the attempt to write the at least a first page of data was unsuccessful;

receiving a third address at the memory device from the external host; and attempting to write the at least a first page of data from the first storage location to the memory array at a location specified by the third address, without the external host re-sending the at least a first page of data to the memory device.

12. The method of claim 11, further comprising:

receiving replacement bytes at the memory device, from the external host;

receiving a byte address of a starting byte of data bytes of the at least the first page of data in the first storage location which are to be replaced by the replacement bytes; and replacing the data bytes of the at least a first page of data in the first storage location with the replacement bytes, based on the byte address of the starting byte, before the attempting to write the at least the first page of data from the first storage location to the memory array at the location specified by the third address.

13. The method of claim 11, wherein:

the attempting to write the at least a first page of data from the first storage location to the memory array at the location specified by the third address, is performed in response to receiving, from the external host, a page buffer program command followed by the third address, the page buffer program command signals to the memory device that a re-write attempt is to be carried out using data in the first storage location and that an address with which the re-write attempt is to be made will follow the page buffer program command.

14. The method of claim 11, wherein:

the first write command comprises a first instance of a first command code which signals to the memory device to perform a write process; and the attempting to write the at least a first page of data from the first storage location to the memory array at the location specified by the third address, is performed in response to receiving, from the external host, an instance of a second command code, followed by the third address, followed by a second instance of the first command code, the instance of the second command code signals to the memory device that a new address is being provided for a re-write attempt using data in the first storage location, and the second instance of the first command code signals to the memory device to initiate the re-write attempt.

15. The method of claim 11, wherein:

the memory device is a non-volatile memory storage medium which is removably connectable to or insertable into the external host.

16. The method of claim 11, wherein:

the first storage location comprises a page buffer and the second storage location comprises a data cache.

17. A method for operating an external host of a memory device, comprising:

transmitting, from the external host to the memory device, at least one page of data, a first address, and at least a first command, the external host is external to the memory device;

the at least a first command signals the memory device to transfer the at least one page of data from a data cache to a page buffer of the memory device, and to attempt to write the at least one page of data from the page buffer to a memory array of the memory device at a location specified by the first address, the memory array comprises storage elements on a die, and the page buffer and the data cache are part of column control circuitry on the die;

receiving, at the external host from the memory device, a status communication indicating that the attempt to write the at least one page of data at the location specified by the first address was unsuccessful; and in response to the status communication, transmitting, from the external host to the memory device, a second address and at least a second command, the at least a second command signals the memory device to attempt to write the at least one page of data from the page buffer to the memory array at a location specified by the second address, without the external host re-sending the at least one page of data to the memory device.

18. The method of claim 17, further comprising:

receiving replacement bytes at the memory device, from the external host;

receiving a byte address of a starting byte of data bytes of the at least one page of data in the page buffer which are to be replaced by the replacement bytes; and replacing the data bytes of the at least one page of data in the page buffer with the replacement bytes, based on the byte address of the starting byte, before the attempting to write the at least one page of data from the page buffer to the memory array at the location specified by the second address.

19. The method of claim 17, wherein:

the at least a first command comprises a first instance of a first command code;

the at least a second command comprises a first instance of a second command code and a second instance of the first command code;

the first instance of the second command code signals the memory device that an address for a re-write attempt from the page buffer follows; and the second instance of the first command code signals the memory device to initiate the re-write attempt.

20. The method of claim 17, wherein:

the at least a second command signals the memory device to attempt to write the at least one page of data from the page buffer to the memory array at the location specified by the second address, without further instruction from the external host.

21. A memory device, comprising:

a memory array of non-volatile storage elements formed on a die, the non-volatile storage elements are arranged in strings;

bit lines in communication with the strings;

a data cache formed on the die;

a page buffer formed on the die and connected to the bit lines, the page buffer and the data cache are part of column control circuitry on the die;

an interface to an external host; and one or more control circuits, the one or more control circuits: (a) receive at least one page of data and a first address, from the external host, via the interface, (b) store the at least one page of data in the page buffer, (c) attempt to write the at least one page of data from the page buffer to the memory array at a location specified by the first address, (d) determine that the attempt to write the at least one page of data was unsuccessful, (e) inform the external host that the attempt to write the at least one page of data was unsuccessful, (f) receive a second address at the memory device, from the external host, and (g) attempt to write the at least one page of data from the page buffer to the memory array at a location specified by the second address, without the external host re-sending the at least one page of data to the memory device.

22. A memory device, comprising:

a memory array of non-volatile storage elements formed on a die, the non-volatile storage elements are arranged in strings;

bit lines in communication with the strings;

a page buffer formed on the die and connected to the bit lines;

a data cache formed on the die, the page buffer and the data cache are part of column control circuitry on the die;

an interface to an external host; and one or more control circuits in communication with the memory array, the page buffer, the data cache and the interface; wherein:

the page buffer receives first page data, and the one or more control circuits cause an attempt to be made to write the first page data from the page buffer to the memory array;

the data cache receives second page data from the memory array, while the page buffer stores the first page data;

the one or more control circuits cause the second page data to be provided to the external host from the data cache; and the one or more control circuits cause an attempt to be made to re-write the first page data from the page buffer to the memory array.

23. The memory device of claim 22, wherein:

the first page data of the re-write attempt [include] *includes* replacement bytes which the page buffer receives from the external host and which bypass the data cache.

24. The memory device of claim 22, wherein:

the page buffer is configured to receive page data from the external host which bypasses the data cache.

*25. The method of claim 1, wherein:*

*the storage elements are arranged in a monolithic three-dimensional memory comprising multiple physical levels above a substrate.*

*26. The method of claim 1, wherein:*

*the storage elements are arranged in a three-dimensional memory structure.*

*27. The method of claim 11, wherein:*

*the storage elements are arranged in a monolithic three-dimensional memory comprising multiple physical levels above a substrate.*

*28. The method of claim 11, wherein:*

*the storage elements are arranged in a three-dimensional memory structure.*

*29. The method of claim 17, wherein:*

*the storage elements are arranged in a monolithic three-dimensional memory comprising multiple physical levels above a substrate.*

*30. The method of claim 17, wherein:*

*the storage elements are arranged in a three-dimensional memory structure.*

*31. The memory device of claim 21, wherein:*

*the non-volatile storage elements are arranged in a monolithic three-dimensional memory comprising multiple physical levels above a substrate.*

*32. The memory device of claim 22, wherein:*

*the non-volatile storage elements are arranged in a monolithic three-dimensional memory comprising multiple physical levels above a substrate.*

*33. The method of claim 1, wherein:*

*the at least one page of data in the page buffer data depends on the second address.*

*34. The method of claim 2, wherein:*

*the replacement bytes point to an address of another page of data.*

* * * * *